(12) United States Patent
Yamazaki et al.

(10) Patent No.: US 10,141,536 B2
(45) Date of Patent: Nov. 27, 2018

(54) DISPLAY DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yoshiharu Hirakata, Kanagawa (JP); Takeshi Nishi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/219,319

(22) Filed: Jul. 26, 2016

(65) Prior Publication Data

US 2016/0336538 A1 Nov. 17, 2016

Related U.S. Application Data

(62) Division of application No. 13/974,220, filed on Aug. 23, 2013, now Pat. No. 9,406,698.

(30) Foreign Application Priority Data

Aug. 28, 2012 (JP) ................................ 2012-188057

(51) Int. Cl.
*H01L 51/52* (2006.01)
*H01L 27/12* (2006.01)
(Continued)

(52) U.S. Cl.
CPC ........ *H01L 51/5246* (2013.01); *G02F 1/1339* (2013.01); *G02F 1/133308* (2013.01);
(Continued)

(58) Field of Classification Search
CPC ....... H01L 51/5237–51/525; H01L 2251/5338
See application file for complete search history.

(56) References Cited

U.S. PATENT DOCUMENTS

| 4,357,557 A | 11/1982 | Inohara et al. |
| 4,640,583 A | 2/1987 | Hoshikawa et al. |
(Continued)

FOREIGN PATENT DOCUMENTS

| EP | 0526232 A | 2/1993 |
| EP | 1109224 A | 6/2001 |
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Mariceli Santiago
(74) *Attorney, Agent, or Firm* — Nixon Peabody LLP; Jeffrey L. Costellia

(57) ABSTRACT

A display device in which reliability of a display element is improved is provided. Alternatively, a display device in which reliability of a transistor is improved is provided. Alternatively, a display device in which an increase in an area of a periphery region is suppressed is provided. A display device includes a display region including a display element between a first flexible substrate and a second flexible substrate in which the display region is surrounded by a first continuous sealant, the first sealant is surrounded by a second continuous sealant, and the second sealant is provided between the first substrate and the second substrate and on at least one of a side surface of the first substrate and a side surface of the second substrate.

14 Claims, 16 Drawing Sheets

(51) Int. Cl.
  *H01L 51/56*  (2006.01)
  *G02F 1/1333*  (2006.01)
  *G02F 1/1339*  (2006.01)
  *H01L 27/32*  (2006.01)
  *H01L 51/00*  (2006.01)
  *H01L 29/786*  (2006.01)

(52) U.S. Cl.
  CPC ...... *H01L 27/1214* (2013.01); *H01L 27/3262* (2013.01); *H01L 51/0097* (2013.01); *H01L 51/524* (2013.01); *H01L 51/5253* (2013.01); *H01L 51/56* (2013.01); *H01L 27/1225* (2013.01); *H01L 29/7869* (2013.01); *H01L 2227/323* (2013.01); *H01L 2251/5338* (2013.01); *H01L 2251/5361* (2013.01)

(56) References Cited

U.S. PATENT DOCUMENTS

| | | |
|---|---|---|
| 5,610,742 A | 3/1997 | Hinata et al. |
| 5,687,465 A | 11/1997 | Hinata et al. |
| 5,731,856 A | 3/1998 | Kim et al. |
| 5,744,864 A | 4/1998 | Cillessen et al. |
| 6,219,127 B1 | 4/2001 | Hirakata et al. |
| 6,294,274 B1 | 9/2001 | Kawazoe et al. |
| 6,563,174 B2 | 5/2003 | Kawasaki et al. |
| 6,580,094 B1 | 6/2003 | Yamazaki et al. |
| 6,605,826 B2 | 8/2003 | Yamazaki et al. |
| 6,727,522 B1 | 4/2004 | Kawasaki et al. |
| 6,809,343 B2 | 10/2004 | Yamazaki et al. |
| 6,864,943 B2 | 3/2005 | Hirakata et al. |
| 6,894,431 B2 | 5/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,112,115 B1 | 9/2006 | Yamazaki et al. |
| 7,145,289 B2 | 12/2006 | Yamazaki et al. |
| 7,189,999 B2 | 3/2007 | Yamazaki et al. |
| 7,199,855 B2 | 4/2007 | Yoshimi et al. |
| 7,211,825 B2 | 5/2007 | Shih et al. |
| 7,230,669 B1 | 6/2007 | Tashiro et al. |
| 7,279,752 B2 | 10/2007 | Yamazaki et al. |
| 7,282,782 B2 | 10/2007 | Hoffman et al. |
| 7,283,185 B2 | 10/2007 | Hirakata et al. |
| 7,297,977 B2 | 11/2007 | Hoffman et al. |
| 7,323,356 B2 | 1/2008 | Hosono et al. |
| 7,369,212 B2 | 5/2008 | Tashiro et al. |
| 7,372,535 B2 | 5/2008 | Tashiro et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,453,089 B2 | 11/2008 | Yamazaki et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,514,864 B2 | 4/2009 | Yamazaki et al. |
| 7,579,203 B2 | 8/2009 | Yamazaki et al. |
| 7,601,236 B2 | 10/2009 | Yamashita et al. |
| 7,633,471 B2 | 12/2009 | Yamazaki et al. |
| 7,674,650 B2 | 3/2010 | Akimoto et al. |
| 7,732,819 B2 | 6/2010 | Akimoto et al. |
| 7,733,457 B2 | 6/2010 | Tashiro et al. |
| 7,738,073 B2 | 6/2010 | Inoue et al. |
| 7,811,147 B2 | 10/2010 | Kim et al. |
| 7,897,003 B2 | 3/2011 | Tashiro |
| 7,935,969 B2 | 5/2011 | Yamashita et al. |
| 7,968,382 B2 | 6/2011 | Jinbo et al. |
| 7,977,876 B2 | 7/2011 | Yamazaki et al. |
| 8,017,945 B2 | 9/2011 | Yamazaki et al. |
| 8,049,419 B2 | 11/2011 | Yamazaki et al. |
| 8,106,407 B2 | 1/2012 | Yamazaki et al. |
| 8,284,138 B2 | 10/2012 | Yamazaki et al. |
| 8,289,481 B2 | 10/2012 | Tashiro et al. |
| 8,319,424 B2 | 11/2012 | Yamazaki et al. |
| 8,405,193 B2 | 3/2013 | Schaepkens et al. |
| 8,497,516 B2 | 7/2013 | Yamazaki et al. |
| 8,581,491 B2 | 11/2013 | Yamashita et al. |
| 8,633,574 B2 | 1/2014 | Schaepkens et al. |
| 8,648,345 B2 | 2/2014 | Yamazaki et al. |
| 8,669,925 B2 | 3/2014 | Yamazaki et al. |
| 8,716,933 B2 | 5/2014 | Yamazaki et al. |
| 8,956,895 B2 | 2/2015 | Yamazaki et al. |
| 8,994,060 B2 | 3/2015 | Jinbo et al. |
| 9,004,970 B2 | 4/2015 | Yamashita et al. |
| 9,184,221 B2 | 11/2015 | Jinbo et al. |
| 9,368,517 B2 | 6/2016 | Yamazaki et al. |
| 9,515,098 B2 | 12/2016 | Yamazaki et al. |
| 9,666,752 B2 | 5/2017 | Yamashita et al. |
| 9,843,015 B2 | 12/2017 | Yamazaki et al. |
| 2001/0046027 A1 | 11/2001 | Tai et al. |
| 2002/0024096 A1 | 2/2002 | Yamazaki et al. |
| 2002/0056838 A1 | 5/2002 | Ogawa |
| 2002/0132454 A1 | 9/2002 | Ohtsu et al. |
| 2002/0196393 A1 | 12/2002 | Tashiro et al. |
| 2003/0189401 A1 | 10/2003 | Kido et al. |
| 2003/0201448 A1 | 10/2003 | Yamazaki et al. |
| 2003/0218222 A1 | 11/2003 | Wager, III et al. |
| 2004/0012747 A1 | 1/2004 | Yamazaki et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0056832 A1 | 3/2005 | Yamazaki et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0176439 A1 | 8/2006 | Tashiro et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0013862 A1 | 1/2007 | Tashiro et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0075316 A1 | 4/2007 | Yamazaki et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0170839 A1* | 7/2007 | Choi ................ H01L 51/5246 313/500 |
| 2007/0170860 A1 | 7/2007 | Choi et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0211197 A1 | 9/2007 | Tashiro et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0029765 A1 | 2/2008 | Yamazaki et al. |
| 2008/0038882 A1 | 2/2008 | Takechi et al. |
| 2008/0038929 A1 | 2/2008 | Chang |
| 2008/0050595 A1 | 2/2008 | Nakagawara et al. |

(56) References Cited

U.S. PATENT DOCUMENTS

| | | |
|---|---|---|
| 2008/0073653 A1 | 3/2008 | Iwasaki |
| 2008/0083950 A1 | 4/2008 | Pan et al. |
| 2008/0106191 A1 | 5/2008 | Kawase |
| 2008/0123042 A1 | 5/2008 | Tashiro et al. |
| 2008/0128689 A1 | 6/2008 | Lee et al. |
| 2008/0129195 A1 | 6/2008 | Ishizaki et al. |
| 2008/0137027 A1 | 6/2008 | Tashiro et al. |
| 2008/0166834 A1 | 7/2008 | Kim et al. |
| 2008/0182358 A1 | 7/2008 | Cowdery-Corvan et al. |
| 2008/0188157 A1 | 8/2008 | Tashiro et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0004772 A1* | 1/2009 | Jinbo ............... H01L 51/56 438/99 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0149224 A1 | 6/2009 | Yamazaki et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0302760 A1 | 12/2009 | Tchakarov et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134746 A1 | 6/2010 | Tashiro et al. |
| 2010/0134747 A1 | 6/2010 | Tashiro et al. |
| 2010/0321758 A1 | 12/2010 | Bugno et al. |
| 2011/0012112 A1 | 1/2011 | Yamazaki et al. |
| 2011/0165918 A1 | 7/2011 | Yamazaki et al. |
| 2011/0222013 A1 | 9/2011 | Kawanishi et al. |
| 2012/0061718 A1 | 3/2012 | Yamazaki et al. |
| 2012/0126234 A1 | 5/2012 | Yamazaki et al. |
| 2012/0161603 A1 | 6/2012 | Van Montfort et al. |
| 2012/0241802 A1 | 9/2012 | Philippens et al. |
| 2012/0287026 A1* | 11/2012 | Masuda ............... H01L 27/3272 345/76 |
| 2012/0300151 A1 | 11/2012 | Yamazaki et al. |
| 2013/0001582 A1 | 1/2013 | Kadono et al. |
| 2013/0012272 A1 | 1/2013 | Yamazaki et al. |
| 2013/0048967 A1 | 2/2013 | Nishido et al. |
| 2013/0134396 A1* | 5/2013 | Shimomura ........ H01L 51/5012 257/40 |
| 2014/0061612 A1 | 3/2014 | Yamazaki et al. |
| 2014/0063432 A1 | 3/2014 | Yamazaki et al. |
| 2017/0263806 A1 | 9/2017 | Yamashita et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 62-091623 | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-005890 A | 1/1993 |
| JP | 05-251705 A | 9/1993 |
| JP | 06-075209 A | 3/1994 |
| JP | 08-264794 A | 10/1996 |
| JP | 10-172757 A | 6/1998 |
| JP | 11-505377 | 5/1999 |
| JP | 2000-044236 A | 2/2000 |
| JP | 2000-048952 A | 2/2000 |
| JP | 2000-150900 A | 5/2000 |
| JP | 2001-203076 A | 7/2001 |
| JP | 2001-222017 A | 8/2001 |
| JP | 2002-015861 A | 1/2002 |
| JP | 2002-049333 A | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-183374 A | 7/2005 |
| JP | 2007-123861 A | 5/2007 |
| JP | 2007-165861 A | 6/2007 |
| JP | 2007-531238 | 11/2007 |
| JP | 2008-210770 A | 9/2008 |
| JP | 2008-211191 A | 9/2008 |
| JP | 2010-244698 A | 10/2010 |
| JP | 2011-018479 A | 1/2011 |
| JP | 2011-044699 A | 3/2011 |
| JP | 2011-192567 A | 9/2011 |
| JP | 2012-054250 A | 3/2012 |
| WO | WO-2004/114391 | 12/2004 |
| WO | WO-2005/052893 | 6/2005 |
| WO | WO-2005/104266 | 11/2005 |
| WO | WO-2011/012371 | 2/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGA2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

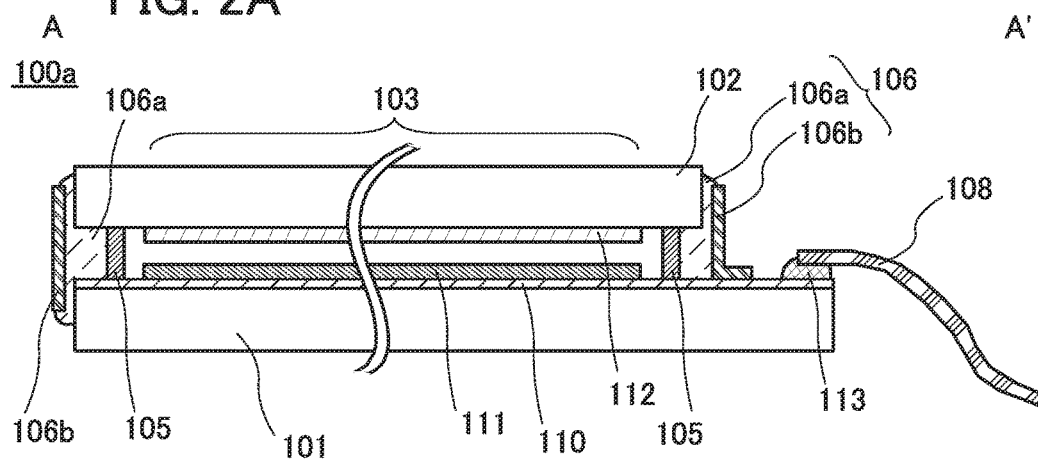
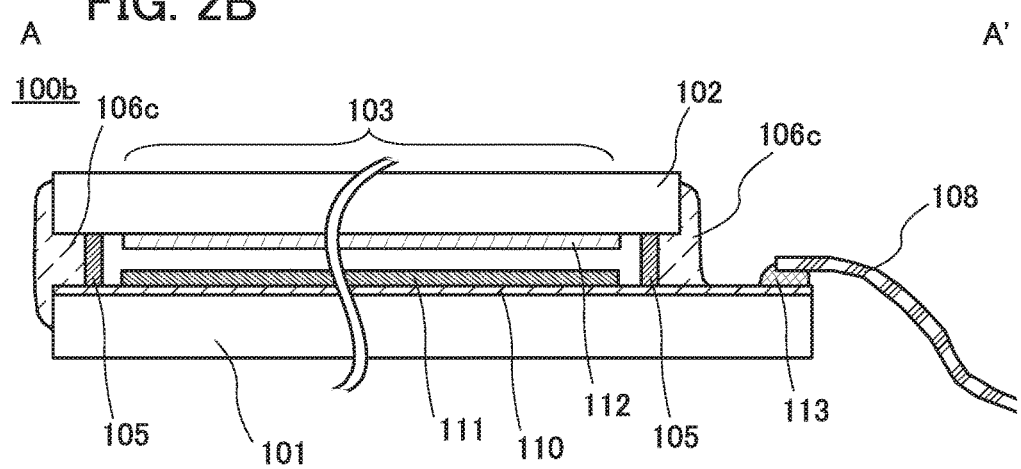
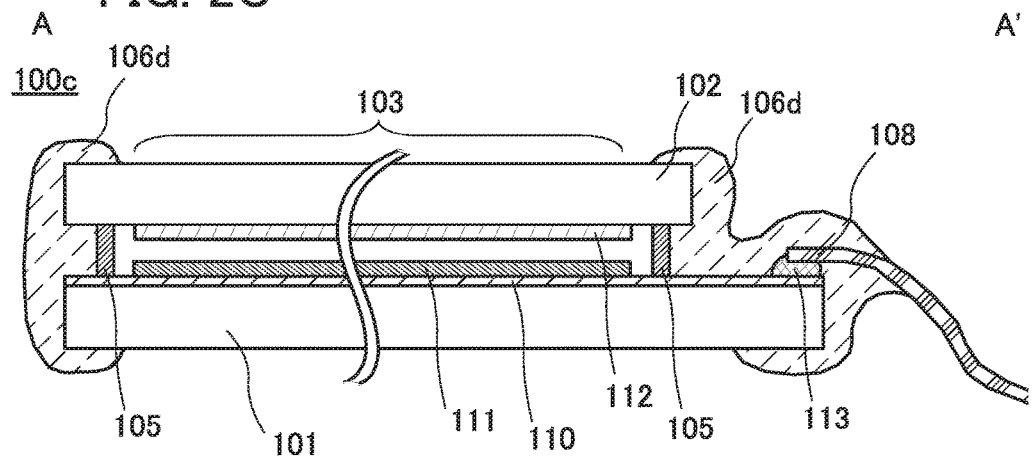

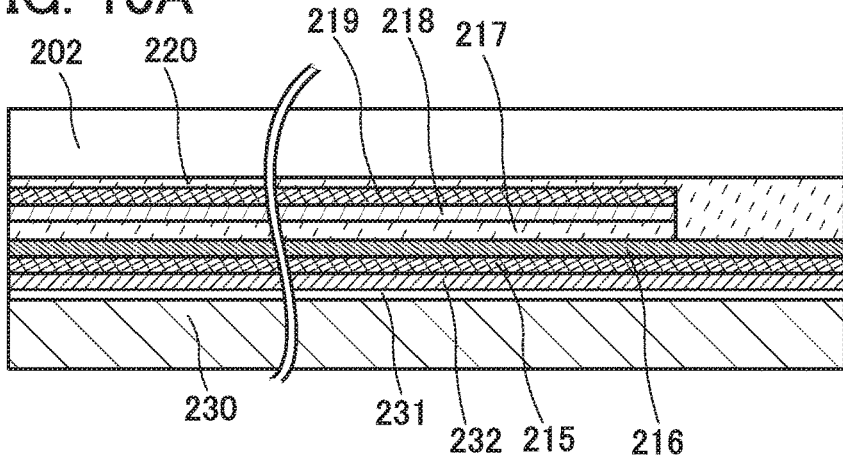
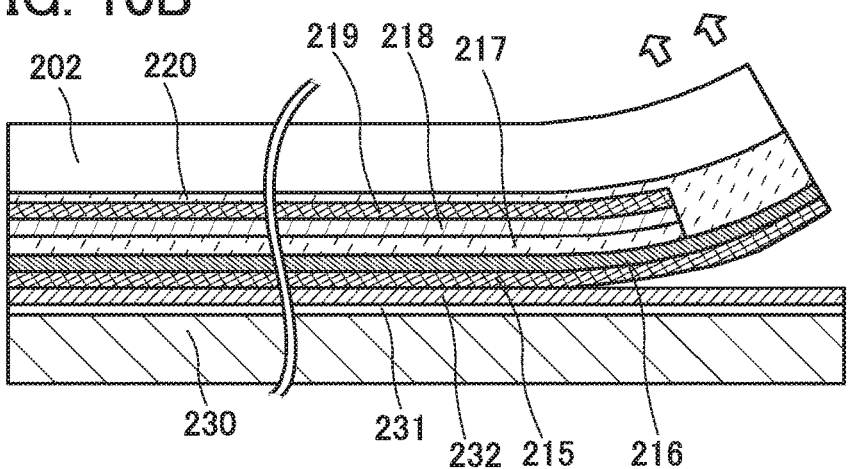
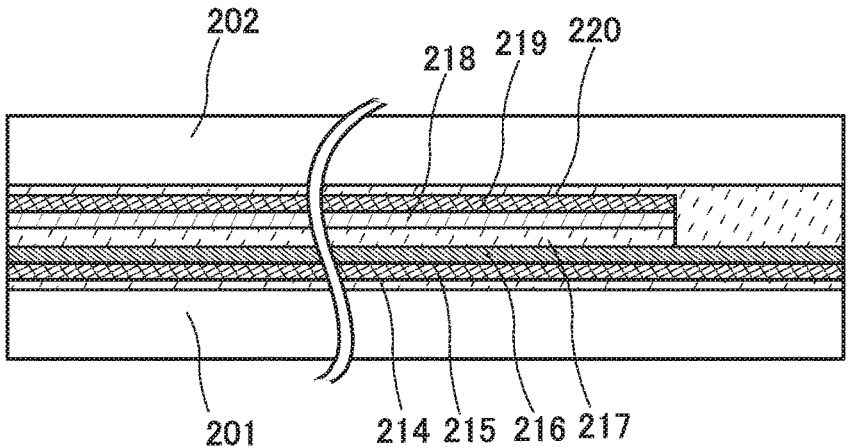

9200

9202

9201  9203

9210

9212

9201  9203

9220

9222

9201  9203

DISPLAY DEVICE AND MANUFACTURING METHOD THEREOF

BACKGROUND OF THE INVENTION

1. Field of the Invention

The present invention relates to an object, a method, or a manufacturing method. The present invention relates to a semiconductor device, a display device, a light-emitting device, or a manufacturing method thereof, for example. In particular, the present invention relates to a semiconductor device including an oxide semiconductor, a display device including an oxide semiconductor, or a light-emitting device including an oxide semiconductor, for example. Alternatively, the present invention relates to a display device for displaying an image.

2. Description of the Related Art

A variety of portable electronic devices, such as a cell phone, a smartphone, a personal computer, a tablet terminal, a portable game machine, and a portable music player, have recently come into widespread use.

In the display portion, a light-emitting device including a light-emitting element, a liquid crystal display device, an electronic paper performing display by an electrophoretic method or an electronic liquid powder method, or the like can be typically used.

For example, research and development of light-emitting elements using electroluminescence (EL) have been actively carried out. In a basic structure of such a light-emitting element, a layer containing a substance with a light-emitting property is interposed between a pair of electrodes. By applying a voltage to this element, light emission can be obtained from the light-emitting substance.

Since the above light-emitting element is a self-luminous type, a light-emitting device using this light-emitting element has advantages such as high visibility, no necessity of a backlight, low power consumption, and the like. Further, such a light-emitting element also has advantages in that the element can be formed to be thin and lightweight and that response time is high.

In order to improve flexibility and impact resistance in addition to its thinness and lightness, a flexible substrate has been proposed to be used in a light-emitting device including the light-emitting element.

Further, as a transistor for driving a display element of a display device, a transistor using a semiconductor thin film which is formed over a substrate having an insulating surface is widely used. A silicon-based semiconductor material is widely known as a material for a semiconductor thin film applicable to such a transistor. In recent years, an oxide semiconductor has attracted attention.

Examples of such a transistor include a transistor in which zinc oxide (ZnO) is used as an oxide semiconductor and a transistor in which $InGaO_3(ZnO)_m$ is used as an oxide semiconductor. A technique in which a switching element, such as a transistor, in which a channel formation region is formed in an oxide semiconductor film, is used for manufacturing an active matrix display device has also been developed.

For example, in Patent Document 1 and Patent Document 2, a display device in which a transistor including an oxide semiconductor in a channel formation region is used for controlling a display element is described. The transistor including the oxide semiconductor in the channel formation region has many advantages in that the transistor has higher field-effect mobility than a transistor using amorphous silicon which is widely spread, can be manufactured with a higher throughput and at lower cost than a transistor using polycrystalline silicon, has extremely low off-state leakage current, and has excellent switching characteristics.

REFERENCE

Patent Document

[Patent Document 1] Japanese Published Patent Application No. 2007-123861
[Patent Document 2] Japanese Published Patent Application No. 2007-165861.

SUMMARY OF THE INVENTION

However, there has been a problem in that the long-term reliability of the conventional display device is not sufficiently secured. In the conventional display device, a display region is provided between a pair of substrates and a sealant is provided between the substrates so as to surround the display region in order to attach the substrates, whereby a display element is sealed. Note that in the case where moisture such as water enters from the outside to the inside of the sealed region, characteristics of the display element and a transistor for driving the display element are degraded and destruction of the element and operation defects may occur.

In particular, in the case where a pair of flexible substrates is used, by the curving of the substrates once or plural times, the sealing capability is degraded and the reliability may be further decreased.

Further, portable electronic appliances and the like having a larger display portion has been desired. The display device generally includes the display region and a peripheral region (also referred to as a frame) and the size of the peripheral region is preferably small. When the size of the peripheral region is large, occupied area of the display region in the substrate area is small; thus, a display portion in the display device becomes small.

Thus, an object of one embodiment of the present invention is to provide a display device in which reliability of a display element is improved.

Another object of one embodiment of the present invention is to provide a display device in which reliability of a transistor is improved.

Another object of one embodiment of the present invention is to provide a display device in which an increase in an area of a periphery region is suppressed.

Another object of one embodiment of the present invention is to provide a method for manufacturing the display device in which reliability of a display element is improved.

Another object of one embodiment of the present invention is to provide a method for manufacturing the display device in which reliability of a transistor is improved.

Another object of one embodiment of the present invention is to provide a method for manufacturing the display device in which an increase in an area of a periphery region is suppressed.

Another object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like using a transparent semiconductor layer. Another object of one embodiment of the present invention is to provide a semiconductor device or the like using a semiconductor layer with high reliability.

Note that in one embodiment of the present invention, it is only necessary that at least one of the above objects is achieved.

Thus, one embodiment of the present invention is a display device including a display region including a display element between a first flexible substrate and a second flexible substrate. The display region is surrounded by a first continuous sealant, the first sealant is surrounded by a second continuous sealant, and the second sealant is provided between the first substrate and the second substrate and on at least one of a side surface of the first substrate and a side surface of the second substrate.

Here, the second sealant has a function of preventing or suppressing entry of substances which are to be impurities (such as water) from the outside to the display element or a transistor. Note that the second sealant may have other functions. For example, the second sealant may have functions of reinforcing the structure, enhancing the adhesiveness, enhancing impact resistance, and the like.

In this specification, a "substrate having flexibility" and a "flexible substrate" refers to a substrate which has a property of being curved. Thus, in the case where a manufactured display device is set to a fixed curved shape, a substrate using for the display device is not excluded from a "substrate having flexibility" or a "flexible substrate".

Further, in this specification, a "continuous" sealant or member included in the sealant indicates that the sealant or the member included in the sealant is continuous so as to form a closed loop, whereby entry of contaminant from the outside can be prevented or suppressed. Thus, in the step of forming a sealant or a member included in the sealant, even if the sealant or the member is formed intermittently or partly, a "continuous" sealant or the member may be formed finally, and even if the sealant and the member included in the sealant have a separated shape, a "continuous" part may be included as a whole.

Further, one embodiment of the present invention is a method for manufacturing a display device including the steps of forming a first continuous sealant surrounding a display region over a first flexible substrate, bonding a second flexible substrate to the first substrate with the first sealant, and forming a second continuous sealant surrounding the first sealant in a gap between the first substrate and the second substrate and on at least one of a side surface of the first substrate and a side surface of the second substrate.

According to one embodiment of the present invention, a display device in which reliability of a display element is improved can be provided.

According to one embodiment of the present invention, a display device in which reliability of a transistor is improved can be provided.

According to one embodiment of the present invention, a display device in which an increase in an area of a periphery region is suppressed can be provided.

According to one embodiment of the present invention, a method for manufacturing the display device in which reliability of a display element is improved can be provided.

According to one embodiment of the present invention, a method for manufacturing the display device in which reliability of a transistor is improved can be provided.

According to one embodiment of the present invention, a method for manufacturing the display device in which an increase in an area of a periphery region is suppressed can be provided.

BRIEF DESCRIPTION OF THE DRAWINGS

In the accompanying drawings:

FIGS. 2A to 2C are cross-sectional views each illustrating one embodiment of a display device;

FIGS. 10A to 10C illustrate an example of a method for manufacturing a display device;

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps or the stacking order of layers. In addition, the ordinal numbers in this specification do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

(Embodiment 1)

In this embodiment, one embodiment of a display device according to the present invention is described with reference to FIGS. 1A and 1B, FIGS. 2A to 2C, and FIG. 3.

Figure 1A:
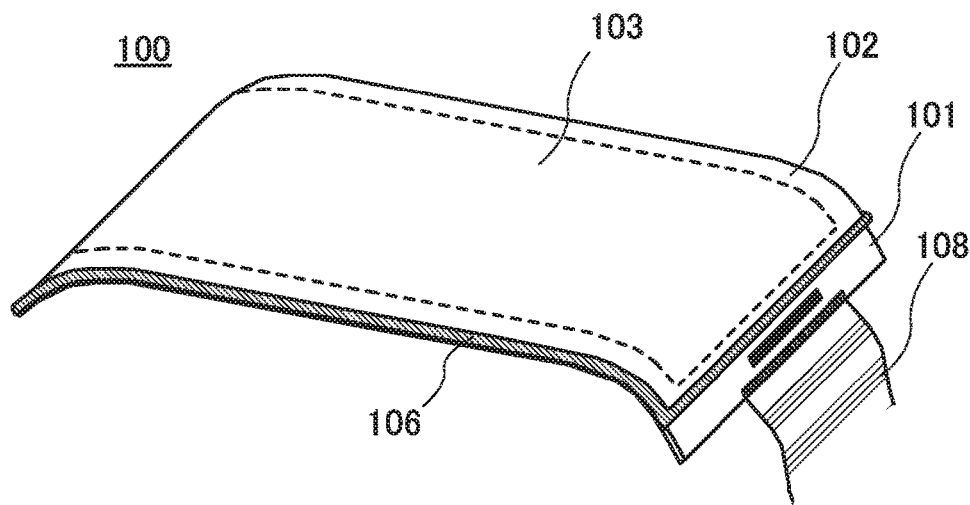
FIGS. 1A and 1B are a perspective view and a plan view illustrating one embodiment of a display device.

FIG. 1A is a bird's-eye perspective view of one embodiment of a display device according to the present invention. A display device 100 includes a flexible substrate 101, a flexible substrate 102 which is provided to face the flexible substrate 101, and a flexible printed circuit (FPC) 108 which is electrically connected to the flexible substrate 101. The flexible substrate 101 is bonded to the flexible substrate 102 by a sealant (not illustrated), and a sealant 106, which is different from the above sealant, is further provided on the side surfaces of the flexible substrate 101 and the flexible substrate 102.

As illustrated in FIG. 1A, the display device according to the present invention uses flexible substrates as a pair of electrodes facing each other. Thus, the whole display device 100 has flexibility. That is, the display device according to the present invention can be curved upward as in FIG. 1A, and although not illustrated, the display device can be curved downward or curved so as to have a wavy shape or twisted shape. Thus, the display device according to the present invention can be used for a display portion having a curved surface of an electronic appliance and the like.

Figure 1B:
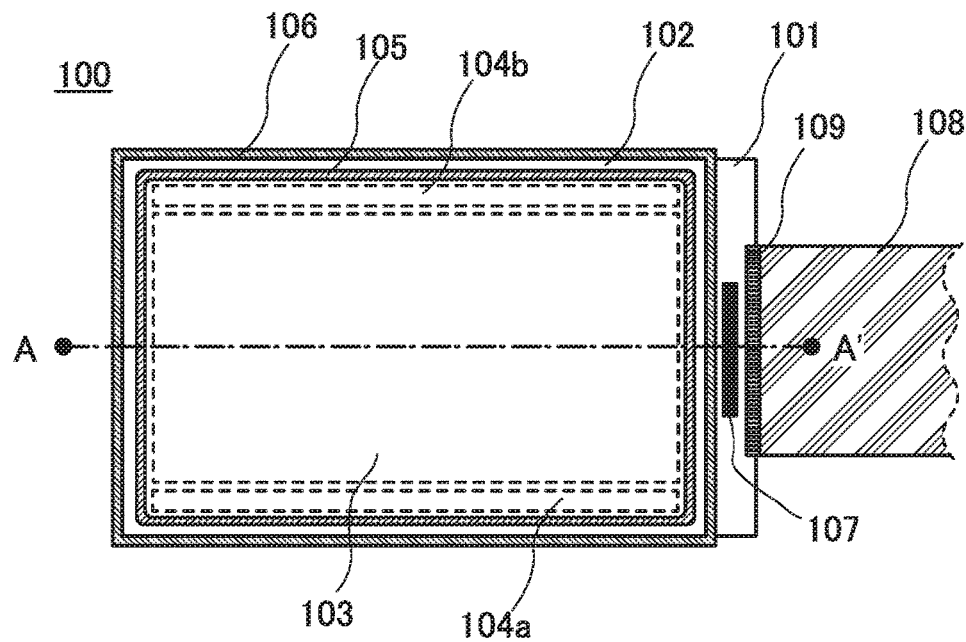

FIG. 1B is a top view of the display device according to the present invention. In FIG. 1B, the display device is not curved. As illustrated in FIG. 1B, the display device 100 includes the flexible substrate 101, the flexible substrate 102 which is provided over the flexible substrate 101 and to face the flexible substrate 101, and the FPC 108 which is electrically connected to the flexible substrate 101. The flexible substrate 101 included in the display device according to this embodiment needs to have a region for connecting the FPC 108. Thus, at at least one side of four sides of the flexible substrate 101, an offset region, which does not face the flexible substrate 102, exists. That is, the area of the flexible substrate 102 is smaller than the area of the flexible substrate 101.

The display device 100 includes a display region 103. The display region 103 includes a display element and is surrounded by a continuous sealant 105. With the sealant 105, the flexible substrate 101 and the flexible substrate 102 facing the flexible substrate 101 are bonded to each other.

In the display device 100 in FIGS. 1A and 1B, scan line driver circuits 104a and 104b are provided with the display region 103 provided therebetween in the region surrounded by the sealant 105. A signal line driver circuit is formed in an IC chip 107 and the IC chip 107 is provided in the offset region of the flexible substrate 101 by a chip on film (COF) method. Further, in order to input an external signal or supply power, the FPC 108 is electrically connected to an external input terminal 109 in the offset region of the flexible substrate 101. However, the display device according to the present invention is not limited to such a structure, and each of the scan line driver circuit and the signal line driver circuit may be formed in the IC chip and placed on the flexible substrate 101, or both the scan line driver circuit and the signal line driver circuit may be formed on the flexible substrate 101.

The sealant 106, which is different from the sealant 105, is provided on the side surface of the display device 100. Specifically, the sealant 106 is provided on the side surface of the flexible substrate 102 and the top surface of the flexible substrate 101 at one side of the display device 100 (the side provided with the offset region) which is connected to the FPC 108, and the sealant 106 is provided continuously on the side surfaces of the flexible substrate 101 and the flexible substrate 102 to form a closed loop shape as a whole at the other three sides of the display device 100 (the sides not provided with the offset region).

As described above, in the display device 100, a double sealing structure in which the display region 103 is surrounded by the sealant 105 and the sealant 106 is formed, whereby entry of water, moisture, or the like to the display region 103 can be prevented or suppressed, and the reliability of the display device 100 having flexibility can be improved.

Next, sealing structures of the display device 100 according to one embodiment of the present invention are described in detail with reference to FIGS. 2A to 2C and FIG. 3. FIGS. 2A to 2C and FIG. 3 illustrate display devices having different sealing structures, each of which illustrates a cross-sectional view taken along line A-A' in the top view of the display device 100 in FIG. 1B.

FIG. 2A is a cross-sectional view of a display device 100a, which shows an example of the sealing structure of the display device 100. The flexible substrate 102 is provided over the flexible substrate 101 and to face the flexible substrate 101. The flexible substrate 101 is bonded to the flexible substrate 102 by the sealant 105. An insulating layer 110 is provided over the flexible substrate 101 and an element layer 111 is provided over the insulating layer 110. Thus, the flexible substrate 101 can be referred to as an element substrate.

The insulating layer 110 serves as a base film of the element layer 111, and has functions of ensuring a planarity for forming the element layer 111, insulating the element layer 111 and the flexible substrate 101 from each other, and preventing entry of contaminant from the flexible substrate 101 to the element layer 111.

The element layer 111 includes at least a display element for displaying an image in the display region 103 and an element for driving the display element. For example, the display element is a light-emitting element using organic EL, and the element for driving the display element is a transistor including a semiconductor film in a channel formation region. Further, the element layer 111 may include a wiring layer electrically connecting these elements, a wiring layer for transmitting a signal from the outside, an insulating layer for insulation, a scan line driver circuit, and the like.

In the drawings, the element layer 111 is provided in a region surrounded by the sealant 105; however, not all components of the element layer 111 need to be provided only in the region surrounded by the sealant 105. For example, an insulating layer used for forming the element for driving the display element may be extended to the outside of the sealant 105 or a wiring layer connected to the element may be extended to the outside of the sealant 105. That is, at least the display element included in the element layer 111 of the sealant and the element for driving the display element may be provided in the region surrounded by the sealant 105.

As the display element, a light-emitting element using organic EL can be used. In FIG. 2A, a light-emitting element is used as the display element, whereby a top-emission display device which emits light from the light-emitting element to the upper side of the display device can be provided.

Further, a color filter layer 112 is provided over the flexible substrate 102 (under the flexible substrate 102 in the drawing) which is provided to face the flexible substrate 101. The color filter layer 112 includes, for example, a red (R) color filter, a green (G) color filter, a blue (B) line filter, a light-blocking layer (a black matrix), an overcoat layer, and the like. However, these components can be added or omitted in accordance with a display mode or the like of the display device 100. For example, in the case where the display device 100 is a light-emitting device in which light-emitting elements are included in the element layer 111 and emit red light, green light, and blue light, the color filter is not necessarily used. Further, in the case where a transparent or semitransparent member is used for the flexible substrate 101, a bottom-emission light-emitting device which emits light from the light-emitting element to the lower side can be provided, and in this case, the color filter layer 112 is not necessary.

As illustrated in FIG. 2A, the area of flexible substrate 102 is smaller than that of the flexible substrate 101, and the flexible substrate 101 has an exposed portion where the flexible substrate 101 does not face the flexible substrate 102. This portion is referred to as the offset region in this specification. The FPC 108 which inputs an external signal or supplies power is electrically connected to the offset region. Although not illustrated, in an external input terminal, the FPC 108 is electrically connected to the element layer 111 provided in the portion surrounded by the sealant 105 through an anisotropic conductive film 113.

The anisotropic conductive film 113 is formed by curing a paste-form or sheet-form material that is obtained by mixing conductive particles to a thermosetting resin or a thermosetting and photo-curing resin. The material exhibits anisotropic conductivity by light irradiation or thermocompression bonding. As conductive particles used for the anisotropic conductive film 113, for example, particles of a spherical organic resin coated with thin-film metal such as Au, Ni, Co, or the like can be used.

The sealant 105 has not only a function of bonding the flexible substrate 101 and the flexible substrate 102, which is described above, but also a function of preventing or suppressing entry of contaminant such as water which becomes an impurity for the display element and the element for driving the display element into the region surrounded by the sealant 105. Thus, the sealant 105 is preferably formed continuously to surround the display region 103. Moreover, the sealant 105 may have a function of keeping a distance between the flexible substrate 101 and the flexible substrate 102, and may also have a function of relieving an impact or a stress applied to the display device 100a.

As the sealant 105, for example, a resin material such as an epoxy resin, an acrylic resin, or a urethane resin can be used. These resin materials may be a thermosetting type or a photo-curing type, or both of them. Further, as the sealant 105, a resin in which different kinds of resins, for example, an acrylic-based resin and an epoxy-based resin, are mixed may be used. A UV initiator, a thermosetting agent, a coupling agent, or the like is mixed into the resin as appropriate. Further, the sealant 105 may include filler. As the filler, a sphere or a cylinder of an inorganic insulator such as silica can be used. By mixing filler, the viscosity and the intensity of the sealant 105 can be adjusted. In addition, by designing the size of the filler appropriately, the filler can have a function of keeping a certain distance between the flexible substrate 101 and the flexible substrate 102.

Alternatively, as the sealant 105, other than the above resins, frit glass (a glass material using glass frit) including low-melting-point glass can be used. In the case of using frit glass as the sealant 105, higher airtightness can be obtained than in the case of using a resin.

As described above, by providing the sealant 105, the display region 103 is shielded from the outside and entry of contaminant such as moisture into the display region 103 can be prevented or suppressed. In addition, the flexible substrate 101 and the flexible substrate 102 are bonded and the intensity of the display device can be improved. Thus, a flexible display device with high reliability can be manufactured.

The sealant 106 includes a member 106a and a member 106b. The sealant 106 is provided to surround the sealant 105 and outside the sealant 105 and is provided in contact with a gap between the substrates, which is formed by the flexible substrate 101, the flexible substrate 102, and the sealant 105 and side surfaces of the flexible substrate 101 and the flexible substrate 102. However, at a side of the display device 100a, in which the offset region is provided, the sealant 106 is provided in contact with the gap, the side surface of the flexible substrate 102, and a top surface of the flexible substrate 101.

The sealant 106 has a function of preventing or suppressing entry of substances which are to be impurities (such as water) from the outside to the display element or the transistor. Note that the sealant 106 may have other functions. For example, functions of strengthening the structure, strengthening the adhesiveness, strengthening impact resistance, and the like can be given.

It is preferable that the moisture permeability of the described-above sealants 105 and 106 be as low as possible.

Here, the "moisture permeability" refers to the mass of water permeating a material such as a film with a unit area of 1 m² per day (unit: g/m²·day). By making the moisture permeability low, entry of an impurity such as water or moisture from the outside can be prevented or suppressed.

The moisture permeability can be calculated by a moisture permeability test called a MOCON method or a cup method. The MOCON method refers to a method in which water vapor permeating a measurement target material is measured using an infrared sensor. The cup method refers to a method in which moisture permeability is measured from a change in the weight of a moisture absorbent which is placed in a cup and absorbs water vapor that has permeated a measurement target material.

The moisture permeability of a sealant commercially available for use in a light-emitting device, for example, is 16 g/m²·day in the case where the thickness thereof is 100 μm. In the case where a glass layer formed using glass frit is used as a sealant, the moisture permeability of the sealant is 0.01 g/m²·day or less. With the use of a sealing structure according to one embodiment of the present invention, the moisture permeability of a display device can be lower than or equal to the above value.

To the sealant 106, various materials and structures can be applied. Hereinafter, specific examples of the sealant 106 are described with reference to FIGS. 2A to 2C and FIG. 3.

In the display device 100a illustrated in FIG. 2A, the sealant 106 includes the member 106b provided around the outermost perimeter and the member 106a provided between the member 106b and the substrates.

For the member 106b, a metal material, a plastic material, or the like can be used, and as the metal material, a material including aluminum, stainless steel (SUS), lead, nickel, or the like can be used. These materials have lower moisture permeability than a resin material; thus, by providing the member 106b, the reliability of the display device can be improved.

Further, solder may be used as the member 106b. For the solder, a material containing a Sn—Pb-based component, a Pb—Sn—Sb-based component, a Sn—Sb-based component, a Sn—Pb—Bi-based component, a Sn—Cu-based component, a Sn—Pb—Cu-based component, a Sn—In-based component, a Sn—Ag-based component, a Sn—Pb—Ag-based component, a Pb—Ag-based component, a Sn—Zn-based component, or the like can be used. Note that Pb is especially harmful to the human body and environment; thus, lead-free solder is preferably used. At this time, the melting point of the solder is preferably lower than that of the member 106a.

The member 106a is positioned between the side surfaces of the flexible substrate 101 and the flexible substrate 102 and the member 106b. The member 106a may have a function of bonding these flexible substrates 101 and 102 and the member 106b in addition to a function of sealing the display region 103.

As the member 106a, for example, a resin material such as an epoxy resin, an acrylic resin, or a urethane resin can be used. These resin materials may be a thermosetting type or a photo-curing type, or both of them. Further, as the member 106a, a resin in which different kinds of resins, for example, an acrylic-based resin and an epoxy-based resin, are mixed may be used. A UV initiator, a thermosetting agent, a coupling agent, or the like is mixed into the resin as appropriate.

Alternatively, as the member 106a, other than the above resins, the above frit glass can be used.

Note that the member 106a may be formed by using a material which can be used for the member 106b. At this time, the member 106b is not necessarily provided.

The member 106a and the member 106b are provided on part of the side surfaces of the flexible substrate 101 and the flexible substrate 102 in FIG. 2A; however, the members 106a and 106b may be provided on the entire side surfaces or on part of surfaces opposite to the surfaces of the flexible substrate 101 and the flexible substrate 102 which face each other (that is, surfaces on which the element layer 111 and the color filter layer 112 are not provided).

The width of the member 106b and the member 106a is preferably less than or equal to 1 mm, more preferably less than or equal to 0.5 mm.

In this manner, in the display device 100a, the display region formed by the element layer is doubly surrounded by the sealant 105 and the sealant 106, whereby entry of contaminant from the outside can be prevented or suppressed. Thus, the long-term reliability of the display device 100a can be sufficiently secured.

A display device 100b illustrated in FIG. 2B is different from the display device 100a in that the sealant 106 is formed of only a single member 106c. Thus, the other structures of the display device 100b are the same as those of the display device 100a.

As the member 106c, for example, a resin material such as an epoxy resin, an acrylic resin, or a urethane resin can be used. These resin materials may be a thermosetting type or a photo-curing type, or both of them. Further, as the member 106c, a resin in which different kinds of resins, for example, an acrylic-based resin and an epoxy-based resin, are mixed may be used. A UV initiator, a thermosetting agent, a coupling agent, or the like is mixed into the resin as appropriate.

Further, solder may be used as the member 106c. For the solder, a material containing a Sn—Pb-based component, a Pb—Sn—Sb-based component, a Sn—Sb-based component, a Sn—Pb—Bi-based component, a Sn—Cu-based component, a Sn—Pb—Cu-based component, a Sn—In-based component, a Sn—Ag-based component, a Sn—Pb—Ag-based component, a Pb—Ag-based component, a Sn—Zn-based component, or the like can be used. Note that Pb is especially harmful to the human body and environment; thus, lead-free solder is preferably used. At this time, the melting point of the solder is preferably lower than that of the sealant 105.

Alternatively, as the member 106c, other than the above resins or solder, the above frit glass can be used.

As in the display device 100b, in a display device 100c illustrated in FIG. 2C, the sealant 106 is formed of a single member 106d; however, the member 106d is provided not only on the side surfaces of the flexible substrate 101 and the flexible substrate 102, but also on part of surfaces opposite to the surfaces of the flexible substrate 101 and the flexible substrate 102 which face each other (that is, surfaces on which the element layer 111 and the color filter layer 112 are not provided). Further, in the offset region, the member 106d is provided to cover part of the FPC 108 and the anisotropic conductive film 113.

With such a structure, contact areas between the substrates and the member 106d are increased, so that sealing property can be high. Further, the edge portions and the corners of the substrates are covered with the member 106d, whereby the substrates can be protected from a physical impact.

In particular, the display device using the flexible substrate according to the present invention is extremely thin; thus, it is preferable that the entire side surfaces of the substrates be covered in order that the display region 103 can be sealed and the display device 100c can be protected.

Figure 3:
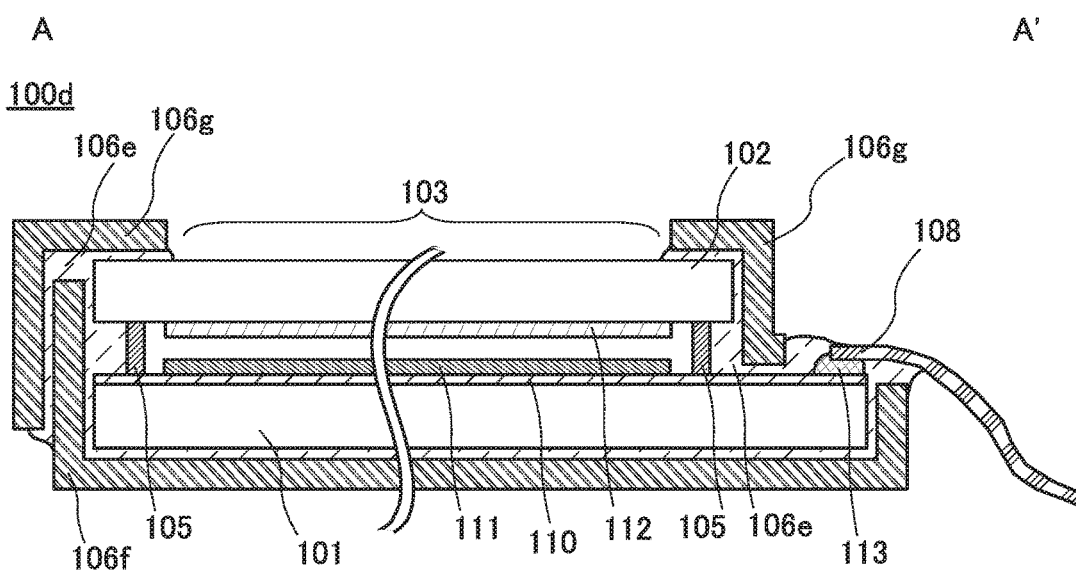
FIG. 3 is a cross-sectional view illustrating one embodiment of a display device.

A display device 100d illustrated in FIG. 3 is sealed by the sealant 106 including members 106f, 106g, and 106e. The member 106f and the member 106g function as a bottom cover and a top cover, respectively, and the member 106e functions as a bonding layer with which gaps between these members 106f and 106g and the substrates are filled.

A structure body sandwiched between the flexible substrate 101 and the flexible substrate 102 is surrounded by a box formed of the member 106f and the member 106g; thus, the side surfaces of the substrates are sufficiently sealed and the reliability of the display device 100d is improved.

For each of the members 106f and 106g, a material having low moisture permeability and flexibility can be used. For example, a metal material, a plastic material, elastic synthetic rubber, or the like can be used for the members 106f and 106g, and as the metal material, a material including aluminum, stainless steel (SUS), lead, nickel, and the like which is rolled out thinly can be used.

The structures, methods, and the like described in this embodiment can be combined with any of the structures, methods, and the like described in the other embodiments as appropriate.

(Embodiment 2)

In this embodiment, as an example of a method for manufacturing the display device according to the present invention, a method for manufacturing the display device 100a described in Embodiment 1 is described with reference to FIGS. 4A to 4D and FIGS. 5A to 5C.

Figure 4A:
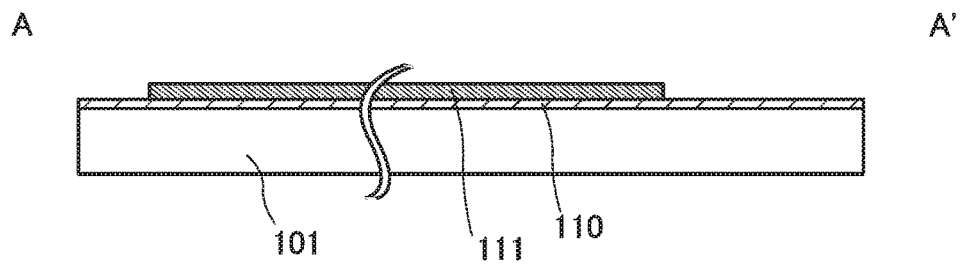
FIGS. 4A to 4D illustrate an example of a method for manufacturing a display device.

First, as illustrated in FIG. 4A, the element layer 111 is formed over the flexible substrate 101 with the insulating layer 110 provided therebetween.

As the flexible substrate 101, for example, a flexible metal base can be used. As the base, a thin base (e.g., a sheet or a film) containing a metal element, specifically, a metal sheet or a metal film of titanium or the like, or an alloy sheet or an alloy film of stainless steel or the like can be used. Among them, a sheet or a film of stainless steel which is relatively inexpensive and available is preferable.

Further, other than the metal base, a resin base having heat resistance may be used. As the resin base, a flexible substrate can be used; for example, a polyethylene terephthalate resin, a polyethylene naphthalate resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, an amorphous cyclic olefin polymer (COP), or the like can be preferably used. Further, the coefficient of thermal expansion of the flexible substrate 101 is preferably lower than or equal to 30 ppm/K, more preferably lower than or equal to 10 ppm/K. In addition, over the flexible substrate 101, a protective film having low moisture permeability may be formed in advance, and examples thereof include a film containing nitrogen and silicon such as a silicon nitride film or a silicon oxynitride film, a film containing nitrogen and aluminum such as an aluminum nitride film, and the like. Note that a structure in which a fibrous body is impregnated with an organic resin (also called prepreg) may be used as the flexible substrate 101.

In this embodiment, in the case where frit glass is used as a sealant, for the flexible substrate 101, a metal base having higher heat resistance than a resin material is preferably used in order to perform laser irradiation.

The insulating layer 110 can be deposited by a sputtering method or a CVD method. The insulating layer 110 is preferably formed using an inorganic insulating film. For example, the inorganic insulating film can have a single-layer structure or a multi-layer structure of an insulating film selected from an oxide insulating film, a nitride insulating film, an oxynitride insulating film, and a nitride oxide insulating film. Note that "nitride oxide" contains more nitrogen than oxygen and "oxynitride" contains more oxygen than nitrogen.

The insulating layer 110 serves as a base film of the element layer 111, and has functions of ensuring a planarity for forming the element layer 111, insulating the element layer 111 and the flexible substrate 101 from each other, and preventing entry of contaminant from the flexible substrate 101 to the element layer 111.

In the case where frit glass is used for the sealant 105, in general, the adhesion of frit glass to a base of a material containing a metal element (e.g., a metal plate, a metal sheet, a metal film, or the like) is low compared with the adhesion of frit glass to a base containing silicon oxide (e.g., a plate-like, sheet-like, or film-like glass substrate, a silicon oxide film, or the like); however, frit glass can have sufficient adhesion by forming the insulating layer 110 of a silicon oxide film or the like.

The element layer 111 includes at least a display element such as a light-emitting element and an element such as a transistor for driving the display element. The element layer 111 is described later.

A wiring included in the element layer 111 and electrically connected to the scan line driver circuits 104a, 104b, and the like is electrically connected to the element for driving the display element included in the element layer 111. The wiring may be formed using a conductive layer included in the element for driving the display element or may be formed using a conductive layer provided separately from the element for driving the display element.

Figure 4B:
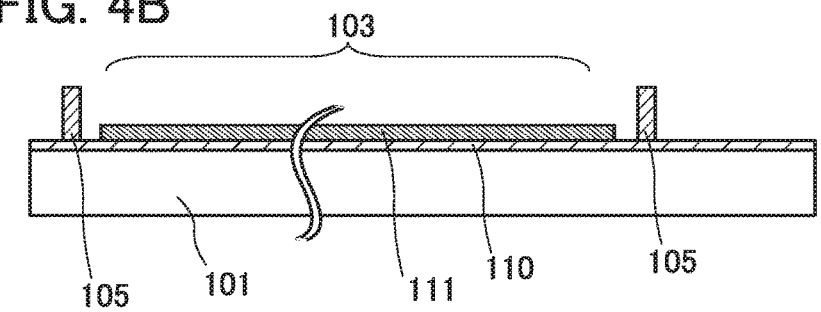

Next, as illustrated in FIG. 4B, the sealant 105 is provided to surround the display region 103.

In the case where the sealant 105 is formed using a resin material such as an epoxy resin, an acrylic resin, or a urethane resin, a continuous seal pattern having a closed-loop shape is formed using a screen printing apparatus, an ink-jet apparatus, a dispensing apparatus, or the like. Note that the seal pattern may be formed in a rectangular, circular, elliptical, or polygonal shape.

In the case where the sealant 105 is formed using frit glass, a continuous frit paste obtained by mixing glass powder and an adhesive organic resin is formed to surround the display region 103 over the insulating layer 110 by using a dispensing apparatus, a printing apparatus, or the like. After that, heat treatment is performed to remove the organic substance in the frit paste and cure the frit paste, so that the sealant 105 is formed.

As the glass powder used for the frit glass, it is possible to use a material containing one or more of the following: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass, for example.

Although not illustrated, after that, the frit glass is irradiated with a first laser beam from a direction of the top surface of the flexible substrate 101 to be baked, so that the glass powder component in the frit glass is bound.

There is no particular limitation on the first laser beam; various laser light sources can be used as long as it can heat the frit glass. For example, a gas laser typified by an excimer laser or a solid-state laser typified by a YAG laser can be used as a light source. The solid laser is smaller and more excellent in productivity than the gas laser; thus, the wavelength of the laser beam is preferably within an infrared light region, and a wavelength of from 780 nm to 2000 nm is employed. For example, laser beam having a wavelength of 810 nm or 940 nm is unlikely to be absorbed by an organic resin and the organic resin is unlikely to be heated; thus, the member 106a described later can be formed as close to the frit glass as possible. In addition, the end portion of the display region 103 can be formed as close to the frit glass as possible, so that the frame size of the display device 100 can be narrowed and the resolution of the display device 100 can be increased. Note that the beam shape of the laser beam is not particularly limited and can be a rectangular shape, a linear shape, a circular shape, or the like.

Figure 4C:
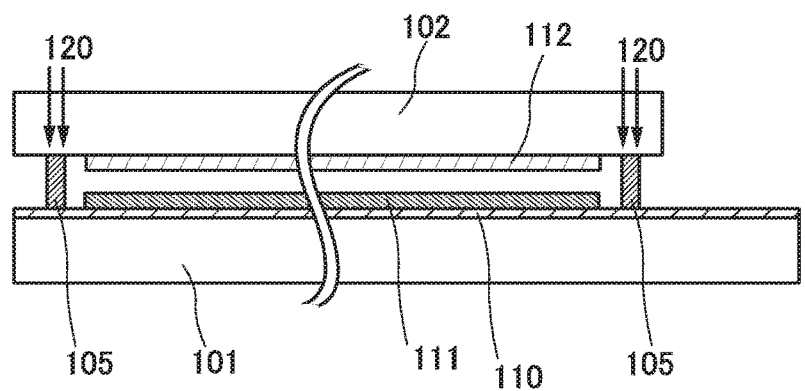

Next, as illustrated in FIG. 4C, the flexible substrate 102 is bonded to the flexible substrate 101 so as to face the flexible substrate 101.

As the flexible substrate 102, for example, a light-transmitting flexible sheet glass having high strength can be used.

Over the flexible substrate 102, the color filter layer 112 is provided in advance.

After the flexible substrate 102 is aligned with and positioned over the flexible substrate 101, the sealant 105 is cured and the flexible substrate 101 and the flexible substrate 102 are bonded.

In the case where the sealant 105 is formed using a resin material such as an epoxy resin, an acrylic resin, or a urethane resin, the resin material is cured in such a way that ultraviolet rays 120 are applied when the resin is an ultraviolet curable resin or that heat is applied when the resin is a thermosetting resin.

In the case where the sealant 105 is formed using frit glass, frit paste may be irradiated with a second laser beam through the light-transmitting flexible substrate 102 to remove the organic substance in the frit paste and cure the frit paste. The second laser beam can be the same as the first laser beam.

Next, the sealant 106 is provided in the periphery of the sealant 105. In this embodiment, the sealant 106 includes the member 106a and the member 106b.

Figure 4D:
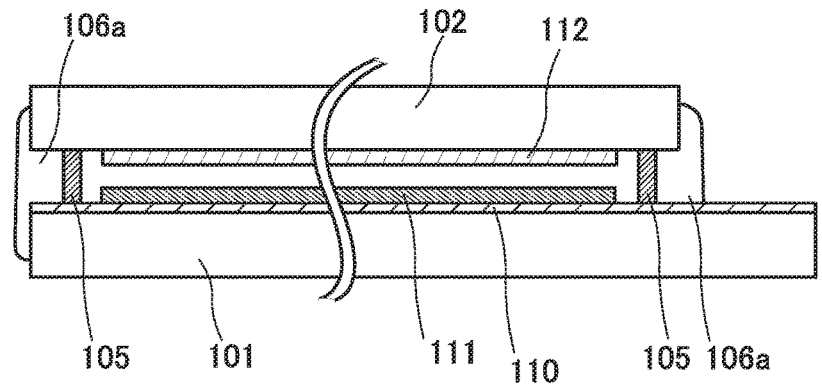

In FIG. 4D, the side surface of a structure body in which the flexible substrates 101 and 102 are bonded by the sealant 105 is sealed by the member 106a.

The member 106a is formed on the side surfaces of the flexible substrates 101 and 102 and between the flexible substrates 101 and 102 by using a dispensing apparatus or the like. Further, in the offset region, the member 106a is formed on the side surface of the flexible substrate 102, between the flexible substrates 101 and 102, and on the top surface of the flexible substrate 101.

As the member 106a, for example, a resin material such as an epoxy resin, an acrylic resin, or a urethane resin can be used. These resin materials may be a thermosetting type or a photo-curing type, or both of them. Further, as the member 106a, a resin in which different kinds of resins, for example, an acrylic-based resin and an epoxy-based resin, are mixed may be used. A UV initiator, a thermosetting agent, a coupling agent, or the like is mixed into the resin as appropriate. Further, as the member 106a, the above frit glass can be used. In the case where the member 106a is positioned on the side surfaces of the flexible substrates 101 and 102 by using these materials, a dispensing apparatus can be used, for example. The resin materials or the frit paste is dropped along the periphery of the flexible substrate 102.

In the case where the frit glass is used as the member 106a, the frit glass is dropped by a dispensing apparatus or the like, and then irradiated with a laser beam and pre-baked.

The material of the member 106a is not limited to these materials. For example, the member 106a may be formed in the following manner: a glass ribbon or the like is bonded to the flexible substrates along the periphery of the substrates, heat treatment is performed, and a gap between the flexible substrates 101 and 102 and the like is closed.

Figure 5A:
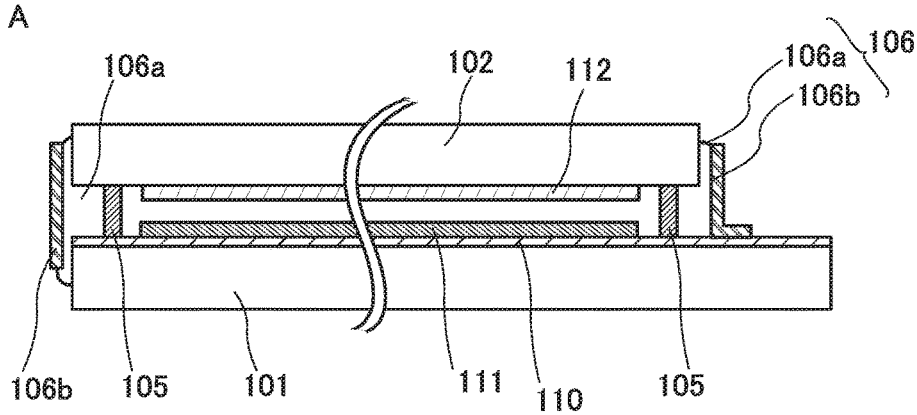
FIGS. 5A to 5C illustrate an example of a method for manufacturing a display device.

Next, in FIG. 5A, the member 106b is provided on an outer side of the paste-form member 106a and in contact with the member 106a. For the member 106b, a metal material, a plastic material, or the like can be used, and as the metal material, a material including aluminum, stainless steel (SUS), lead, nickel, or the like can be used.

Further, solder may be used as the member 106b. For the solder, a material containing a Sn—Pb-based component, a Pb—Sn—Sb-based component, a Sn—Sb-based component, a Sn—Pb—Bi-based component, a Sn—Cu-based component, a Sn—Pb—Cu-based component, a Sn—In-based component, a Sn—Ag-based component, a Sn—Pb—Ag-based component, a Pb—Ag-based component, a Sn—Zn-based component, or the like can be used. Note that Pb is especially harmful to the human body and environment; thus, lead-free solder is preferably used. At this time, the melting point of the solder is preferably lower than that of the member 106a.

In the case of using solder as the member 106b, the member 106b may be formed by soldering the member 106a using a heated tool (a soldering iron) while ultrasonic waves are being emitted from the tip of the soldering iron, for example. Ultrasonic cavitation occurs and the member 106b can be formed while a coating on the member 106a is being removed, for example; thus, the adhesion between the member 106a and the member 106b can be increased.

Figure 5B:
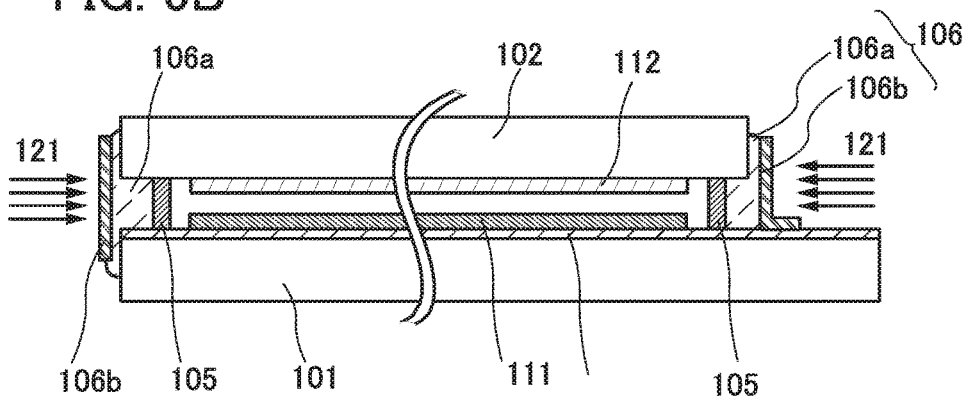

Next, in FIG. 5B, the member 106a is cured, whereby a sealing structure formed by the sealant 106 is formed.

In the case where the member 106a is formed using a resin material such as an epoxy resin or an acrylic resin, the resin material is cured in such a way that ultraviolet rays are applied when the resin is an ultraviolet curable resin or that heat is applied when the resin is a thermosetting resin.

In the case where the member 106a is formed using frit glass, as illustrated in FIG. 5B, frit paste is irradiated with a second laser beam through the member 106b to remove the organic substance in the frit paste and cure the frit paste. The second laser beam is emitted from the side surface direction of the flexible substrates 101 and 102. For example, irradiation with the laser beam 121 is performed in a direction parallel to a stack of the flexible substrates 101 and 102 while the stack of the flexible substrates 101 and 102 is being rotated in the parallel direction. Further, the second laser beam can be the same as the first laser beam.

Note that in the case where solder is used for the member 106b, frit paste used for the member 106a is preferably cured by emitting the second laser beam in advance.

Figure 5C:
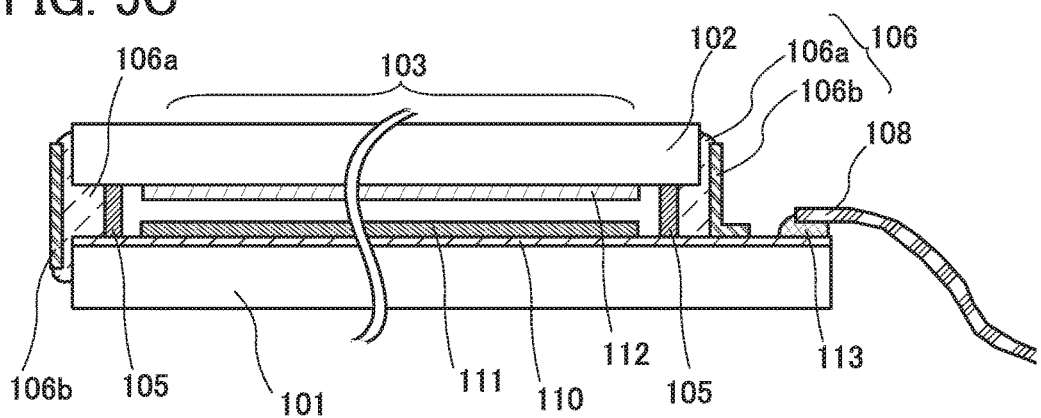

Next, in FIG. 5C, the FPC 108 is connected to the offset region. The FPC 108 is electrically connected to an external input terminal provided over the flexible substrate 101 through the anisotropic conductive film 113.

As described above, a double sealing structure of the display region 103 can be formed by using the sealant 105 and the sealant 106.

By forming such a sealing structure, entry of contaminant such as water from the outside to the display region 103 hardly occurs, so that the reliability of the display device 100a can be improved.

The structures, methods, and the like described in this embodiment can be combined with any of the structures, methods, and the like described in the other embodiments as appropriate.

(Embodiment 3)

In this embodiment, one embodiment of a display device according to the present invention, which is different from the display device described in Embodiment 1, is described with reference to FIGS. 6A and 6B, FIGS. 7A to 7C, and FIG. 8.

Figure 6A:
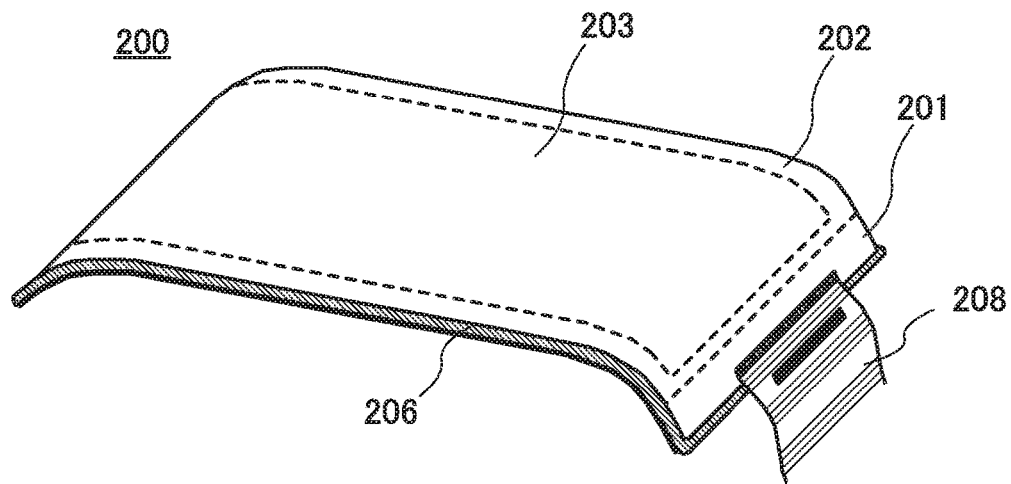
FIGS. 6A and 6B are a perspective view and a plan view illustrating one embodiment of a display device.

FIG. 6A is a bird's-eye perspective view of one embodiment of a display device according to the present invention. A display device 200 is different from the display device 100 described in Embodiment 1 in that shapes of a flexible substrate 201 and a flexible substrate 202 are substantially the same and there is no offset region.

The display device 200 includes the flexible substrate 201, the flexible substrate 202 which is provided to face the flexible substrate 201, and an FPC (flexible printed circuit) 208 which is electrically connected to the flexible substrate 201. The flexible substrate 201 is electrically connected to the FPC 208 through an opening formed in the flexible substrate 202, which is described later. The flexible substrate 201 is bonded to the flexible substrate 202 by a sealant (not illustrated), and another sealant 206 is further provided on the side surfaces of the flexible substrate 201 and the flexible substrate 202.

As illustrated in FIG. 6A, the display device according to the present invention uses flexible substrates as a pair of electrodes facing each other. Thus, the whole display device 200 has flexibility. The display device is curved upward in FIG. 6A; however, the display device can be curved downward or curved so as to have a wavy shape or twisted shape. Thus, the display device according to the present invention can be used for a display portion having a curved surface of an electronic appliance and the like.

Figure 6B:
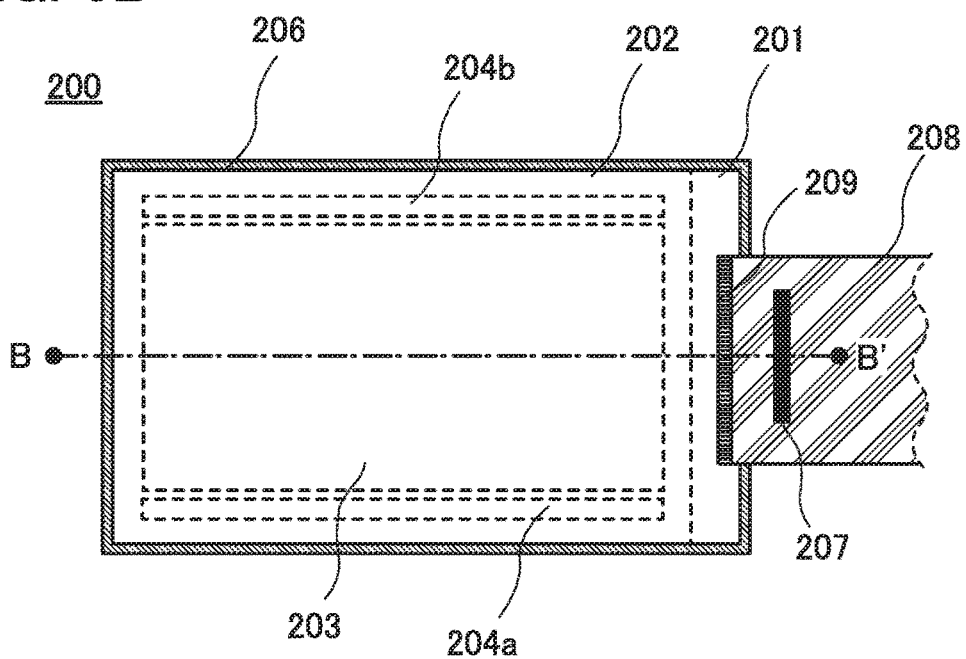

FIG. 6B is a top view of the display device according to one embodiment of the present invention. In FIG. 6B, the display device is not curved. As illustrated in FIG. 6B, the display device 200 includes the flexible substrate 201, the flexible substrate 202 which is provided over the flexible substrate 201 and to face the flexible substrate 201, and the FPC 208 which is electrically connected to the flexible substrate 201.

The FPC 208 is connected to the flexible substrate 201 through the opening formed in the flexible substrate 202. Thus, the display device 200 is different from the display device 100 in Embodiment 1 in that the side surfaces of the flexible substrate 201 and the flexible substrate 202 are positioned substantially coplanarly.

In one embodiment of the display device according to the present invention, scan line driver circuits 204a and 204b are provided with the display region 203 provided therebetween on the flexible substrate 201. A signal line driver circuit is formed in the IC chip 107 and the IC chip 107 is provided on the FPC 208. The FPC 208 is electrically connected to an external input terminal 209 provided over the flexible substrate 201 through the opening formed in the flexible substrate 202. However, the display device according to the present invention is not limited to such a structure, and each of the scan line driver circuit and the signal line driver circuit may be formed in the IC chip and placed on the FPC 208, or the scan line driver circuit and the signal line driver circuit may be formed integrally on the flexible substrate 201.

Since the display device 200 has the above structure, the sealant 206 can be provided on the side surface of the substrate relatively easily compared to the display device 100. Note that in FIG. 6B, the sealant is positioned only on the side surface of the substrate, and not positioned between the substrates; however, a sealant which is different from the sealant 206 may be positioned between the substrates.

As described above, in the display device 200, a sealing structure in which the display region 203 is surrounded by the sealant 206 is formed on side surfaces of substrates, whereby entry of water, moisture, or the like to the display region 203 can be prevented or suppressed, and the reliability of the display device 200 can be improved. Further, in the case of providing the sealant only on the side surface of the substrate, the area occupied by the peripheral region in the display region 203 can be reduced, so that a display device having a narrow frame can be manufactured.

Next, sealing structures of the display device 200 according to one embodiment of the present invention are described in detail with reference to FIGS. 7A to 7C and FIG. 8. FIGS. 7A to 7C and FIG. 8 illustrate display devices having different sealing structures and each of which illustrates a cross section taken along line B-B' in the top view of the display device 200 in FIG. 6B.

Figure 7A:
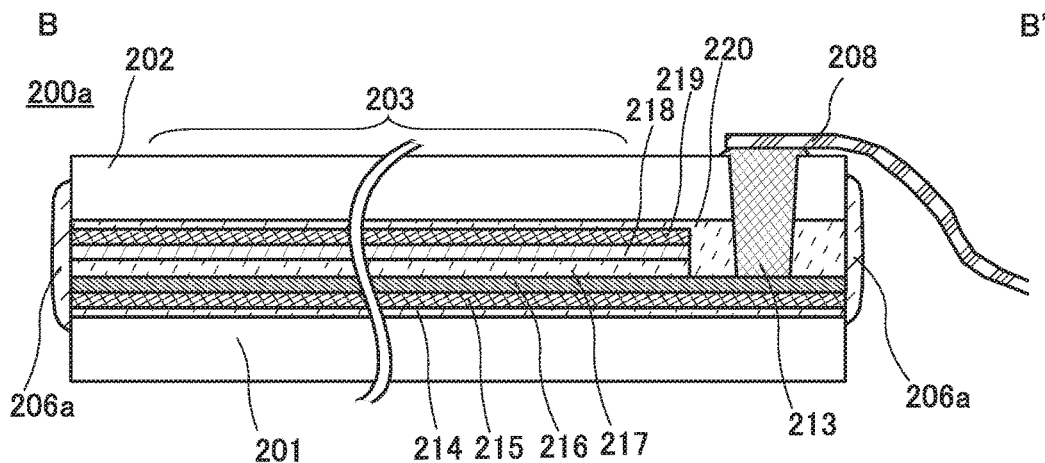
FIGS. 7A to 7C are cross-sectional views each illustrating one embodiment of a display device.

FIG. 7A is a cross-sectional view of a display device 200a, which shows an example of the sealing structure of the display device 200. The flexible substrate 202 is provided over the flexible substrate 201 and to face the flexible substrate 201.

An element layer 216 and a color filter layer 218 are provided between the flexible substrate 201 and the flexible substrate 202. In order to form these layers over the flexible substrate, the following technique is used in the display device 200 according to this embodiment: after a semiconductor element such as a thin film transistor is manufactured over a base such as a glass substrate and a quartz substrate, the semiconductor element is separated from the base, and the semiconductor element is transferred to another base (e.g., the flexible substrate).

Although described later in detail, in order to use the above transfer technique, layers to be separated 215 and 219 and bonding layers 214, 217, and 220 are provided over the flexible substrate 201.

The layers to be separated 215 and 219 are needed in order to separate the element layer 216 including a display element, an element for driving the display element, and the like and the color filter layer 218 including a color filter, a light-blocking film, an overcoat film, and the like from a base used for forming the element layer 216 and the color filter layer 218. The layers to be separated 215 and 219 each function as a buffer layer for separating the element layer 216 and the color filter layer 218 from a separation layer over the base. The layers to be separated 215 and 219 are preferably formed of an insulating film containing nitrogen and can have a single-layer structure or a multi-layer structure of silicon nitride, silicon oxynitride, silicon nitride oxide, or the like.

Further, the bonding layers 214, 217, and 220 are layers for bonding the separated element layer 216 to the color filter layer 218, or these layers to the flexible substrates. As the bonding layers 214, 217, and 220, a light curable adhesive such as a UV curable adhesive, a reactive curable adhesive, a thermal curable adhesive, or an anaerobic adhesive can be used. For example, an epoxy resin, an acrylic resin, a urethane resin, an imide resin, a silicone resin, a phenol resin, or the like can be used. A dry agent (zeolite or the like) having a size less than or equal to the wavelength of light, or a filler with a high refractive index (titanium oxide, zirconium, or the like) is preferably mixed into the adhesive because reliability and light extraction efficiency of the light-emitting element are improved in the case where the light-emitting element is used as the display element.

In the display device 200a illustrated in FIG. 7A, the flexible substrate 201, the bonding layer 214, the layer to be separated 215, the element layer 216, the bonding layer 217, the color filter layer 218, the layer to be separated 219, the bonding layer 220, and the flexible substrate 202 are stacked in this order.

Here, an area of a stack of the bonding layer 217, the color filter layer 218, and the layer to be separated 219 is smaller than an area of a stack of the flexible substrate 201, the bonding layer 214, the layer to be separated 215, and the element layer 216. That is, in an end portion of a display portion, the element layer 216 includes a portion (an offset region) which is exposed to the stack of the bonding layer 217, the color filter layer 218, and the layer to be separated 219. In the offset region, an opening is provided by removing a part of the bonding layer 220 and the flexible substrate 202 over the region, and the element layer 216 is electrically connected to the FPC 208 through the opening.

An anisotropic conductive film 213 is provided in the opening. Thus, an external input terminal provided in the element layer 216 is electrically connected to the FPC 208 through the anisotropic conductive film 213.

In the display device 200a, a sealing structure is formed by providing a member 206a on a side surface of the display device 200a and surrounding a display region by the member 206a.

As the member 206a, for example, a resin material such as an epoxy resin, an acrylic resin, or a urethane resin can be used. These resin materials may be a thermosetting type or a photo-curing type, or both of them. Further, as the member 206a, a resin in which different kinds of resins, for example, an acrylic-based resin and an epoxy-based resin, are mixed may be used. A UV initiator, a thermosetting agent, a coupling agent, or the like is mixed into the resin as appropriate.

Further, solder may be used as the member 206a. For the solder, a material containing a Sn—Pb-based component, a Pb—Sn—Sb-based component, a Sn—Sb-based component, a Sn—Pb—Bi-based component, a Sn—Cu-based component, a Sn—Pb—Cu-based component, a Sn—In-based component, a Sn—Ag-based component, a Sn—Pb—Ag-based component, a Pb—Ag-based component, a Sn—Zn-based component, or the like can be used. Note that Pb is especially harmful to the human body and environment; thus, lead-free solder is preferably used. At this time, the melting point of the solder is preferably lower than the melting points of the flexible substrates 201, 202, and the bonding layer. Further, as a material for the flexible substrates 201 and 202 and the bolding layer, a material having heat resistance at the melting point of the solder may be used.

Figure 7B:
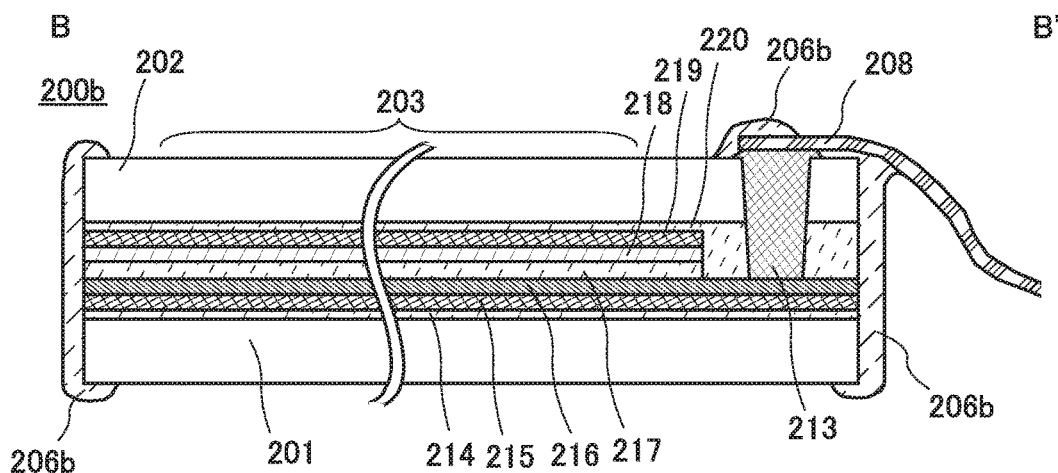

A display device 200b illustrated in FIG. 7B is different from the above display device 200a in that a member 206b functioning as a sealant is provided on part of a top surface and a bottom surface of the flexible substrates. Further, the member 206b is also provided on a portion in which the FPC 208 is electrically connected to the element layer 216.

By positioning the member 206b in such a manner, the sealing capability and the reliability of the display device 200b can be further improved.

For the member 206b, a material used for the member 206a can be used.

Figure 7C:
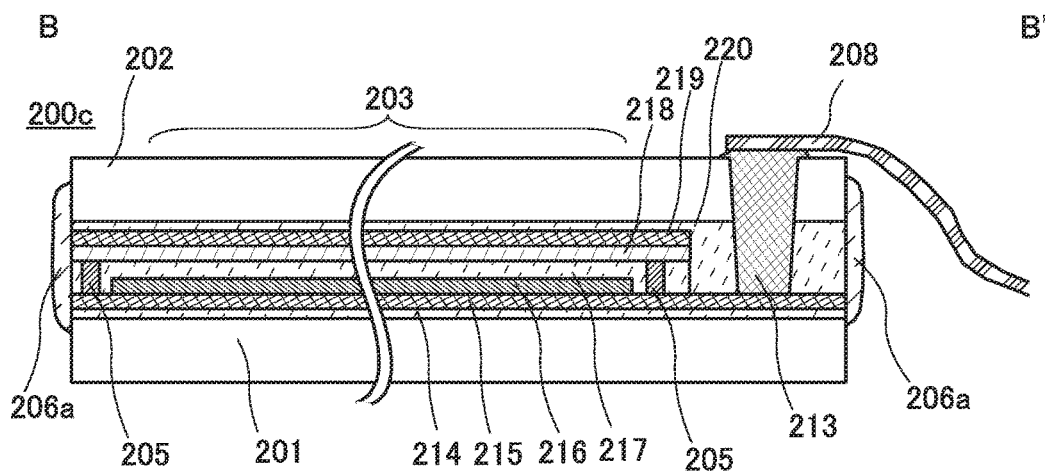

A display device 200c illustrated in FIG. 7C is a display device in which the sealant 205 is provided between the flexible substrate 201 and the flexible substrate 202 in addition to the structure of the display device 200a illustrated in FIG. 7A. The sealant 205 is formed continuously so as to surround the display region 203. In FIG. 7C, the sealant 205 is provided over the layer to be separated 215 and in contact with the layer to be separated 215 and the color filter layer 218. However, the stacked structure is not limited thereto, and the sealant 205 may be provided over an insulating layer included in the element layer 216, or in contact with another layer such as the layer to be separated 219, the substrate, or the base.

As the member of the sealant 205, for example, a resin material such as an epoxy resin, an acrylic resin, or a urethane resin can be used. These resin materials may be a thermosetting type or a photo-curing type, or both of them. Further, as the sealant 205, a resin in which different kinds of resins, for example, an acrylic-based resin and an epoxy-based resin, are mixed may be used. A UV initiator, a thermosetting agent, a coupling agent, or the like is mixed into the resin as appropriate.

The sealant 205 is surrounded by the member 206a which is another sealant on the outer side of the sealant 205. By doubly sealing the display region 203 by using the sealant 205 and the member 206a in this manner, the reliability of the display device 200c can be improved.

Figure 8:
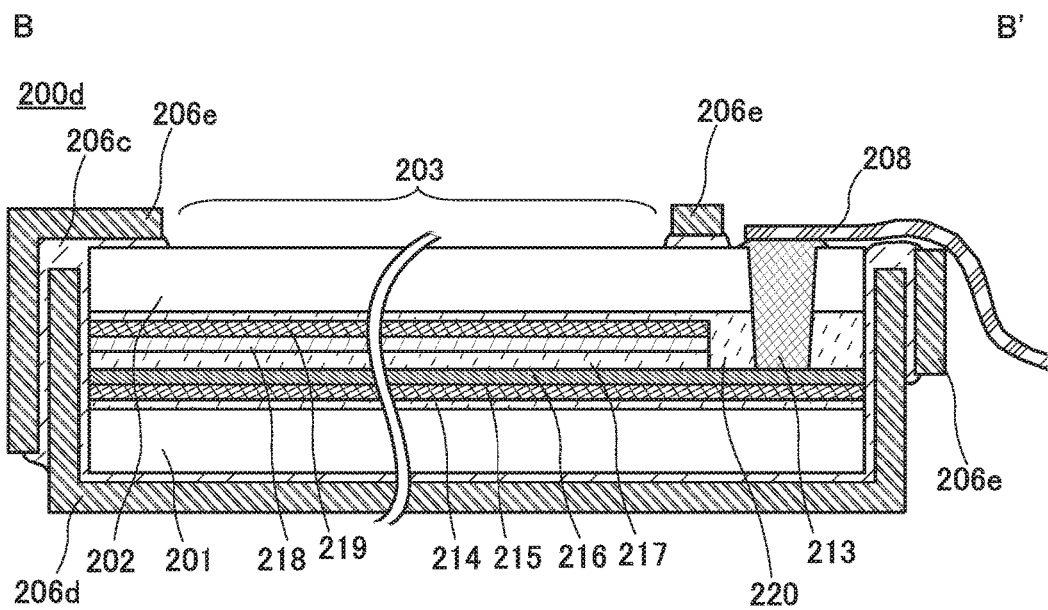
FIG. 8 is a cross-sectional view illustrating one embodiment of a display device.

A display device 200d illustrated in FIG. 8 is a display device in which the display device 200a illustrated in FIG. 7A is sealed with a sealant 206 including members 206d, 206e, and 206c. The member 206d and the member 206e function as a bottom cover and a top cover, respectively, and the member 206c functions as a bonding layer with which gaps between these members 206d and 206e and the substrates are filled.

A structure body sandwiched between the flexible substrate 201 and the flexible substrate 202 is surrounded by a box formed of the member 206d and the member 206e; thus, the side surfaces of the substrates are sufficiently sealed and the reliability of the display device 200d is improved.

For each of the members 206d and 206e, a material having low moisture permeability and flexibility can be used. For example, a metal material, a plastic material, elastic synthetic rubber, or the like can be used for the members 206d and 206e, and as the metal material, a material including aluminum, stainless steel (SUS), lead, nickel, and the like which is rolled out thinly can be used.

The structures, methods, and the like described in this embodiment can be combined with any of the structures, methods, and the like described in the other embodiments as appropriate.

(Embodiment 4)

In this embodiment, as an example of a method for manufacturing the display device according to the present invention, an example of a method for manufacturing the display device 200a described in Embodiment 3 is described with reference to FIGS. 9A to 9D, FIGS. 10A to 10C, and FIGS. 11A to 11C.

A process of forming the element layer 216 and the like on a support substrate 230 (a process of forming an element substrate) is described.

Figure 9A:
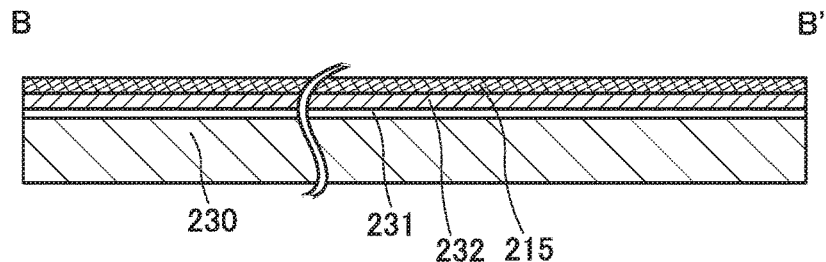
FIGS. 9A to 9D illustrate an example of a method for manufacturing a display device.

First, a base layer 231, a separation layer 232, and the layer to be separated 215 are formed over the support substrate 230 in this order (see FIG. 9A).

A base which does not have flexibility but can withstand the process temperature in this embodiment is preferably used as the support substrate 230. For example, a glass substrate, a quartz substrate, a sapphire substrate, a ceramic substrate, a metal substrate, or the like can be used.

As the glass substrate, in the case where the temperature of heat treatment to be performed later is high, a glass substrate having a strain point of 730° C. or higher is preferably used. Further, as the glass substrate, a glass material such as aluminosilicate glass, aluminoborosilicate glass, or barium borosilicate glass is used, for example. The glass substrate is preferably subjected to heat treatment for shrinking the substrate in advance. For example, as the heat treatment, heating at 650° C. is preferably performed twice.

In this manner, by forming the element layer 216 and the like on the support substrate 230 which is a base which does not have flexibility, a stack is easily handled in a manufacturing process of the display device 200 and the display device 200 can be manufactured with high yield.

The base layer 231 is preferable because in the case where a base containing impurities such as a glass substrate is used as the support substrate 230, the base layer 231 can prevent contamination from the glass substrate and the like.

As the base layer 231, an insulating layer such as a silicon oxide film, a silicon oxynitride film, a silicon nitride film, or a silicon nitride oxide film can be used.

As the base layer 231, the above-described insulating film is formed by a chemical vapor deposition method such as a plasma CVD method, a thermal CVD method, or a physical vapor deposition method such as a sputtering method. Note that the base layer 231 may be formed by a printing method, a coating method, or the like instead of the above methods.

The separation layer 232 has a single-layer structure or a stacked-layer structure containing an element selected from tungsten, molybdenum, titanium, tantalum, niobium, nickel, cobalt, zirconium, ruthenium, rhodium, palladium, osmium, iridium, or silicon; an alloy material containing any of the elements; or a compound material containing any of the elements. A crystal structure of a layer containing silicon may be amorphous, microcrystal, or polycrystal.

In the case where the separation layer 232 has a single layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

The separation layer 232 can be formed by a sputtering method, a plasma CVD method, a coating method, a printing method, or the like. Note that the coating method includes a spin coating method, a droplet discharge method, and a dispensing method.

The layer to be separated 215 is preferably formed of a nitrogen-containing insulating film and can have a single-layer structure or a multi-layer structure of silicon nitride, silicon oxynitride, silicon nitride oxide, or the like. The layer to be separated 215 can be formed by the above-described physical vapor deposition method, the above-described chemical vapor deposition method, a coating method, a printing method, or the like. For example, the layer to be separated 215 is formed at a temperature of higher than or equal to 250° C. and lower than or equal to 400° C. by a plasma CVD method, whereby a dense film having very low moisture permeability can be obtained. Note that the thickness of the layer to be separated 215 is preferably greater than or equal to 10 nm and less than or equal to 3000 nm, further preferably greater than or equal to 200 nm and less than or equal to 1500 nm.

Next, heat treatment is performed to modify the entire or part of the separation layer 232. That is, by performing heat treatment, oxidization or nitridation of the entire or part of the separation layer 232 is performed, so that an oxide insulating film, an oxynitride insulating film, or a nitride oxide insulating film is formed. For example, the separation layer 232 can be a layer containing tungsten, an oxide insulating layer is formed by heat treatment, and a layer containing an oxide of tungsten can be formed at an interface between the tungsten layer and the insulating layer. The temperature of the heat treatment differs depending on a substrate to be used; however, the heat treatment is performed at a temperature range of 450° C. to 700° C. In addition, it is possible to form the layer containing an oxide of tungsten which is the layer to be separated 215 by subjecting the surface of the layer containing tungsten formed as the separation layer 232 to heat oxidation treatment, oxygen plasma treatment, treatment with a solution having strong oxidizing power, such as ozone water, or another treatment. Further, plasma treatment or heat treatment may be performed in an atmosphere of oxygen, nitrogen, nitrous oxide alone, or a mixed gas of any of these gasses and another gas.

Figure 9B:
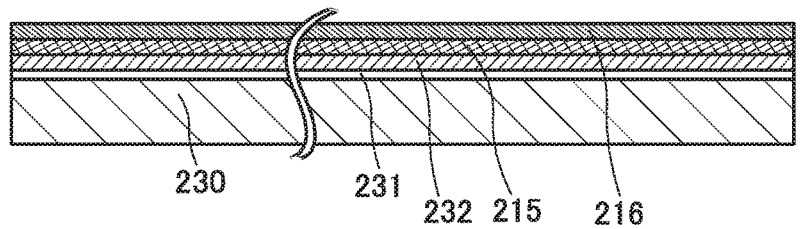

After that, the element layer 216 including a display element and an element for driving the display element is formed over the layer to be separated 215 (see FIG. 9B).

As an example of the display element, a light-emitting element using organic EL is given, and as the element for driving the display element, a transistor including a semiconductor film in a channel formation region is given. The transistor can be manufactured by a known method for manufacturing a transistor. Note that the external input terminal 209 may be formed by utilizing a process of manufacturing a transistor or separately formed without utilizing the process of manufacturing the transistor.

In the light-emitting element which is an example of the display element, a layer containing a light-emitting substance is formed between a pair of electrodes. Specifically, the layer containing a light-emitting substance is formed between a first electrode layer and a second electrode layer. The structure, material, and the like of the light-emitting element are described later.

Further, the light-emitting element is covered with an inorganic insulating film which does not transmit impurities such as water and oxygen so that the light-emitting element is not exposed, whereby reliability of the light-emitting element and the display device 200 can be improved. An oxide insulating film, a nitride insulating film, an oxynitride insulating film, a nitride oxide insulating film, or the like can be used as the inorganic insulating film. Specifically, an insulating film containing silicon or aluminum can be used.

Next, a process of forming the color filter layer 218 and the like on a support substrate 235 (a process of forming a counter substrate) is described.

A base layer 236, a separation layer 237, and the layer to be separated 219 are formed in this order over the support substrate 235 which is different from the support substrate 230.

A base similar to that of the support substrate 230 can be used for the support substrate 235. Further, the base layer 236, the separation layer 237, and the layer to be separated 219 can be formed in a manner similar to that of the base layer 231, the separation layer 232, and the layer to be separated 215.

Next, heat treatment is performed and the entire or part of the separation layer 237 is modified. This heat treatment may be performed in a manner similar to that of the separation layer 232, and another treatment for modifying the surface of the separation layer 237 may be performed instead of the heat treatment.

After that, the color filter layer 218 is formed over the layer to be separated 219.

The color filter layer 218 includes, for example, a color filter, a light-blocking layer (a black matrix), and an overcoat layer.

The light-blocking layer is formed in a desired position with a known material by a printing method, a coating method, an etching method using a photolithography technique, or the like.

Then, the color filter is formed between the light-blocking layers which are provided apart from each other. Each color filter is formed in a desired position with a known material by a printing method, a coating method, an etching method using a photolithography technique, or the like.

In the case where an overcoat layer covering the color filter and the light-blocking layer is provided, the overcoat layer may be formed using a known material by a physical vapor deposition method, a chemical vapor deposition method, a coating method, a printing method, or the like. The overcoat layer is preferably provided because the overcoat layer prevents moisture or impurity components included in the color filter layer from diffusing into the display element in the element layer 216. In the case where the overcoat layer is not provided, the number of steps for forming the overcoat layer can be cut.

Figure 9C:
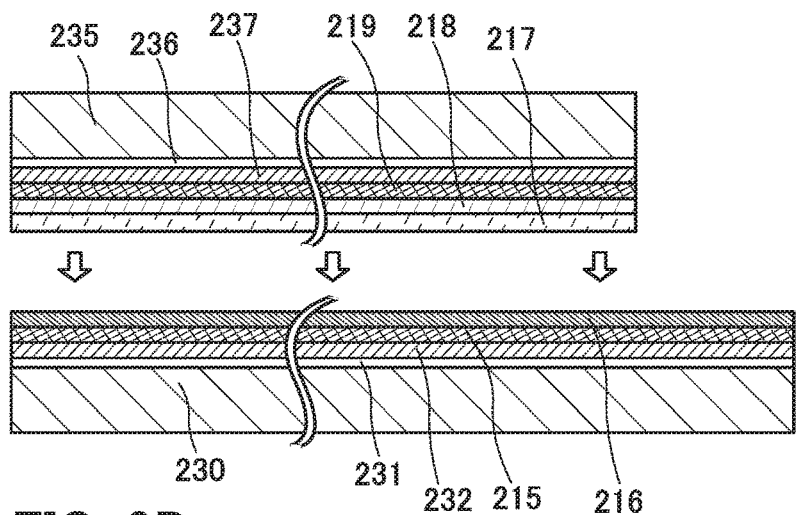

The support substrate 230 including the element layer 216 and the support substrate 235 including the color filter layer 218 which are provided as described above are bonded to each other with the bonding layer 217 (see FIG. 9C). For the bonding layer 217, the above material such as an epoxy resin is preferably used.

Here, in order to secure the offset region where the external input terminal is to be formed, the support substrate 230 including the element layer 216 is formed so that the substrate area is larger than that of the support substrate 235 including the color filter layer 218. Thus, the bonding layer 217 is preferably provided on the side of the support substrate 235 including the color filter layer 218, whose substrate area is small, in advance.

Figure 9D:
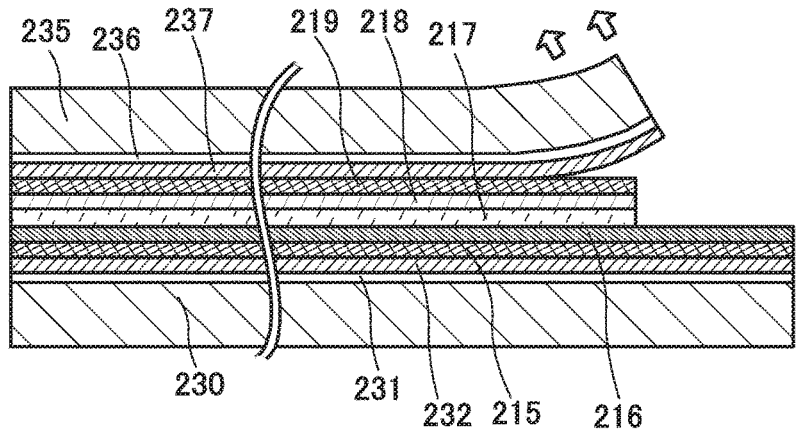

Then, separation is performed between the separation layer 237 and the layer to be separated 219 which are formed on the support substrate 235 (see FIG. 9D).

As the separation method, mechanical force (a separation process with a human hand or with a gripper, a separation process by rotation of a roller, or the like) may be used. Alternatively, liquid can be dropped in the region with low adhesion or a groove formed in the region with low adhesion and an interface between the separation layer 237 and the layer to be separated 219 is filled with the liquid, whereby the separation layer 237 is separated from the layer to be separated 219. At this time, it is preferable that separation be performed while vibration such as ultrasound is applied. Alternatively, a method in which a fluoride gas such as $NF_3$, $BrF_3$, or $ClF_3$ is introduced into the region with low adhesion or the groove formed in the region with low adhesion and the separation layer 237 is removed by etching with the use of the fluoride gas, thereby separating the separation layer 237 from the layer to be separated 219 may be employed.

As another separation method, in the case where the separation layer 237 is formed using tungsten, separation can be performed while the separation layer is etched by a mixed solution of ammonia water and hydrogen peroxide water.

The separation is performed at the interface between the layer to be separated 219 and the separation layer 237 or in the separation layer 237. Thus, the layer 219 or both the layer 219 and part of the separation layer 237 are left on a substrate including the element layer 216 and the color filter layer 218 after the separation.

Next, the flexible substrate 202 is bonded to the surface which is exposed by the above separation with the bonding layer 220 (see FIG. 10A).

As the flexible substrate 202, a substrate which has flexibility and transmits visible light can be used: for example, a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, an amorphous cyclic olefin polymer (COP), or the like is preferably used. Further, the coefficient of thermal expansion of the flexible substrate 202 is preferably lower than or equal to 30 ppm/K, more preferably lower than or equal to 10 ppm/K. In addition, over the flexible substrate 202, a protective film which has low moisture permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the flexible substrate 202.

In the case where a fibrous body is contained in the material for the flexible substrate 202, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As an example of the glass fiber, a glass fiber using E glass, S glass, D glass, Q glass, or the like can be given. These fibers may be used in a state of a woven fabric or a nonwoven fabric, and a structure body in which this fibrous body is impregnated with an organic resin and the organic resin is cured may be used as the flexible substrate 202. The structure body including the fibrous body and the organic resin is preferably used as the flexible substrate 202, in which case reliability against bending or breaking due to local pressure can be increased.

After that, a stack of the element layer 216, the color filter layer 218, and the like including the flexible substrate 202 and the support substrate 230 are separated from each other (see FIG. 10B). The separation is performed in the following manner: the support substrate 230 is positioned on and in contact with a suction stage and tensile stress is applied to the stack including the element layer 216 and the color filter layer 218. Thus, the separation proceeds at the interface between the layer to be separated 215 and the separation layer 232 or in the separation layer 232.

At this time, when the liquid such as water is added to the portion in which the separation is performed, the liquid enters into the separated portion due to capillary action and a separation process can be promoted.

Thus, the layer 215 or both the layer 215 and part of the separation layer 232 are left on a stack including the element layer 216 and the color filter layer 218 after the separation.

Next, the flexible substrate 201 is bonded to the stack including the element layer 216 and the color filter layer 218 after the separation with the bonding layer 214 (see FIG. 10C). The flexible substrate 201 can be formed using a material similar to that of the above flexible substrate 202.

In this manner, a stack including the element layer 216 and the color filter layer 218 which are sandwiched between the flexible substrate 201 and the flexible substrate 202 is formed.

Figure 11A:
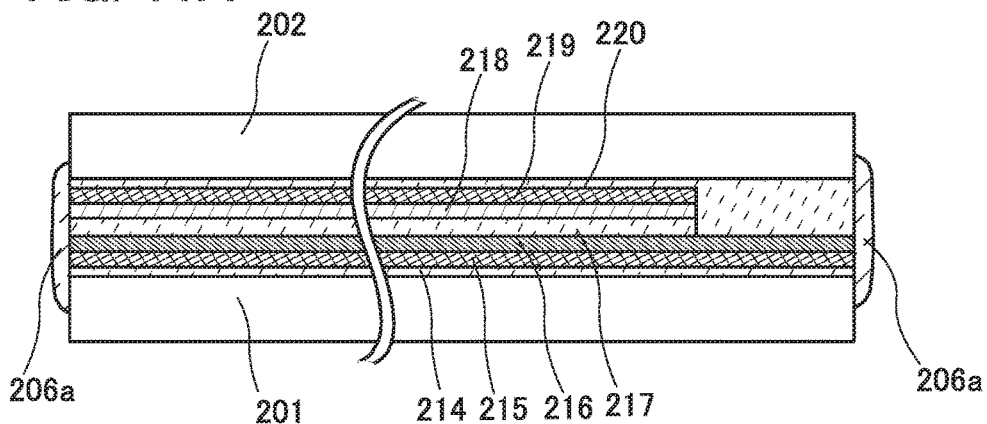
FIGS. 11A to 11C illustrate an example of a method for manufacturing a display device.
Figure 11B:
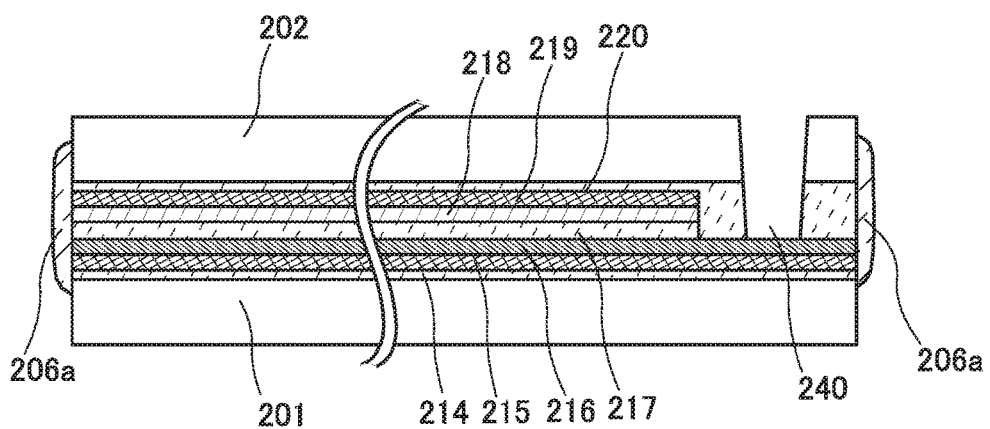
Figure 11C:
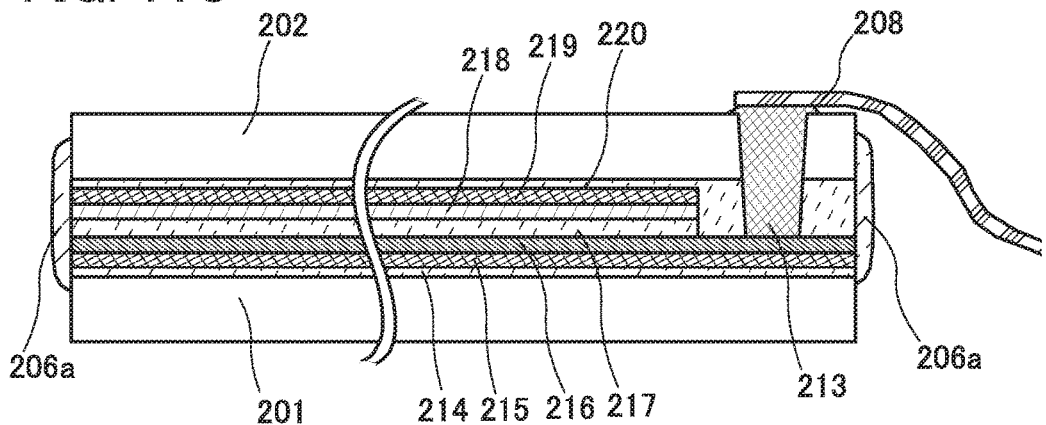

Next, the member 206a functioning as a sealant is provided on the side surface of the stack (see FIG. 11A).

For the member 206a, the material described in the above embodiment can be used.

As the member 206a, for example, a resin material such as an epoxy resin, an acrylic resin, or a urethane resin can be used. These resin materials may be a thermosetting type or a photo-curing type, or both of them. Further, as the member 206a, a resin in which different kinds of resins, for example, an acrylic-based resin and an epoxy-based resin, are mixed may be used. A UV initiator, a thermosetting agent, a coupling agent, or the like is mixed into the resin as appropriate.

Further, solder may be used as the member 206a. For the solder, a material containing a Sn—Pb-based component, a Pb—Sn—Sb-based component, a Sn—Sb-based component, a Sn—Pb—Bi-based component, a Sn—Cu-based component, Sn—Pb—Cu-based component, a Sn—In-based component, a Sn—Ag-based component, a Sn—Pb—Ag-based component, a Pb—Ag-based component, a Sn—Zn-based component, or the like can be used. Note that Pb is especially harmful to the human body and environment;

thus, lead-free solder is preferably used. At this time, the melting point of the solder is preferably lower than that of the member 106a.

Accordingly, the reliability of the display device 200 can be improved.

Next, an opening 240 for electrically connecting the element layer 216 and the FPC 208 is formed.

First, a cut is made in the flexible substrate 202 and the bonding layer 220 so as to surround a region (not illustrated) in the element layer 216 where the external input terminal is formed for electrically connecting to the FPC 208. The cut may be made with a tool such as a sharp edged tool or by irradiation with a laser beam. The degree of pressure is adjusted when the cut is made with the tool, or the intensity is adjusted when the cut is made by irradiation with the laser beam so as not to break the element layer 216 and the like. Further, the cut may be made by combining the use of the tool and the irradiation with the laser beam.

Then, the flexible substrate 202 in a region where the cut is made and surrounding the external input terminal is pulled in the direction approximately orthogonal to the stack, whereby the flexible substrate 202 and the bonding layer 220 in the region can be separated from the stack. An interface between the bonding layer 220 and a conductive layer to be the external input terminal has low adhesion; thus, the external input terminal can be easily exposed (see FIG. 11B). In this manner, the opening 240 can be formed in a part of the flexible substrate 202 and the bonding layer 220.

Next, the anisotropic conductive film 213 is provided in the opening 240 formed by the above method. The FPC 208 is provided over the anisotropic conductive film 213 and the thermocompression is performed, whereby an electrical path which can supply power or input an external signal to the element layer 216 is formed (see FIG. 11C).

The flexible display device 200 with high reliability can be manufactured by including a sealing structure on the side surface by the above method.

The structures, methods, and the like described in this embodiment can be combined with any of the structures, methods, and the like described in the other embodiments as appropriate.

(Embodiment 5)

In this embodiment, according to one embodiment of the display device of the present invention, a flexible light-emitting device using the structure of the display device 100a described in Embodiment 1 is described with reference to FIG. 12.

Figure 12:
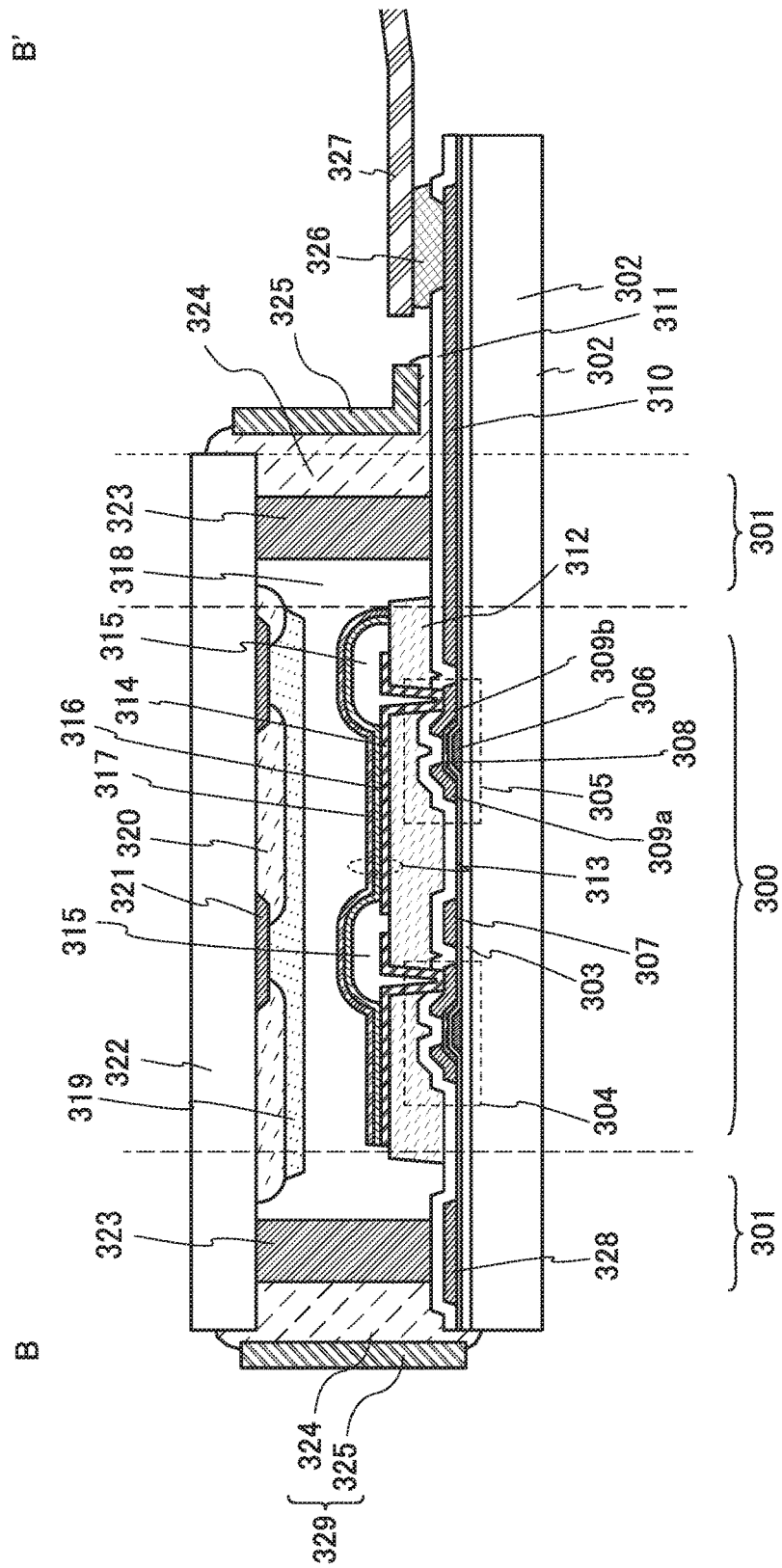
FIG. 12 is a cross-sectional view illustrating one embodiment of a display device.

FIG. 12 illustrates a part of a schematic cross-sectional view illustrating the cross-sectional view of the display device 100a in FIG. 2A in more detail in the case of applying the display device 100a to a light-emitting device. Note that FIG. 12 illustrates a part of the display region 300 provided in the sealed region of the light-emitting device.

Although not illustrated, the light-emitting device according to this embodiment may include a scan line driver circuit on an inner side of a sealant 323. In the case where the light-emitting device includes a scan line driver circuit, as in the display region 300, the scan line driver circuit can be formed in an element layer. An NMOS circuit in which a plurality of n-channel transistors is combined can be formed over an insulating layer 303 provided on a flexible substrate 302. The scan line driver circuit is not limited to an NMOS circuit and may have a variety of circuits such as a CMOS circuit in which an n-channel transistor and a p-channel transistor are used in combination or a PMOS circuit formed of a p-channel transistor. Note that the same applies to the case of providing a signal line driver circuit over the flexible substrate 302 by incorporating the signal line driver circuit with the scan line driver circuit.

FIG. 12 illustrates a cross-sectional structure of a part of a pixel as an example of the display region 300. The pixel includes a switching transistor or a current control transistor; however, here, the pixel includes current control transistors 304 and 305 that are electrically connected to a light-emitting element 313. A source electrode layer or a drain electrode layer 309b of the current control transistors 304 and 305 is electrically connected to a first electrode layer 314 included in the light-emitting element 313. In addition, a partition 315 covering the end portion of the first electrode layer 314 is provided.

Note that there is no particular limitation on the structures of the transistors included in the display region 300 and other circuits such as a scan line driver circuit, a signal line driver circuit, and a protective circuit which are not illustrated. For example, a forward staggered transistor or an inverted staggered transistor may be used.

Furthermore, a top-gate transistor or a bottom-gate transistor may be used. In FIG. 12, a channel-etched transistor is shown; however, a channel-protective transistor using a channel protective film may be used. As a semiconductor material used for the channel formation region in the transistors, for example, a semiconductor material such as silicon or germanium or an oxide semiconductor containing at least one of indium, gallium, and zinc may be used. In particular, it is preferable to use the oxide semiconductor in that the oxide semiconductor has many advantages such as high field-effect mobility and extremely low leakage current at the time of turning off the transistor. The oxide semiconductor is described in detail in another embodiment. Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used.

The transistors in FIG. 12 are bottom-gate transistors as examples. A gate insulating layer 307 is included over a gate electrode layer 306, and a semiconductor layer 308 including a channel formation region is included over the gate insulating layer 307. A source electrode layer and a drain electrode layer 309a and 309b are provided over the semiconductor layer 308 and an insulating layer 311 is provided to cover these electrode layers.

For the gate electrode layer 306 and the source electrode layer and the drain electrode layer 309a and 309b, for example, a layer containing a metal material such as molybdenum, titanium, chromium, tantalum, magnesium, silver, tungsten, aluminum, copper, neodymium, or scandium can be used. Further, the gate electrode layer 306 and the source electrode layer and the drain electrode layer 309a and 309b may each have a single layer or two or more layers.

Each of the gate insulating layer 307 and the insulating layer 311 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide. For example, the gate insulating layer 307 can be stacked layers of a silicon nitride layer and a silicon oxynitride layer. In this case, the silicon nitride layer may have stacked layers of a plurality of silicon nitride layers having different compositions.

Note that in the case where an oxide semiconductor is used for the semiconductor layer 308, in order to make an oxygen saturation state in the oxide semiconductor, it is preferable that insulating layers (the gate insulating layer 307 and the insulating layer 311) which are in contact with an oxide semiconductor layer contain excess oxygen.

As the insulating layer containing excess oxygen, a silicon oxide film or a silicon oxynitride film containing a large amount of oxygen by adjusting deposition conditions as appropriate in a plasma CVD method or a sputtering method is used. Further, oxygen may be added by an ion implantation method, an ion doping method, or plasma treatment.

In addition, a blocking layer (such as an $AlO_x$ layer) for suppressing release of oxygen from the oxide semiconductor layer is preferably provided as the gate insulating layer 307 or the insulating layer 311 so as to be positioned outside the insulating layer containing excess oxygen.

The insulating layer containing excess oxygen or the blocking layer is provided to cover the oxide semiconductor layer, whereby the oxide semiconductor layer can contain oxygen in a proportion which is substantially the same as that in the stoichiometric composition, or in a proportion higher than that in the stoichiometric composition i.e., the oxide semiconductor layer can be supersaturated.

An insulating layer 312 is provided over the insulating layer 311. The insulating layer 312 is formed using, for example, an organic resin such as acrylic and has a plane surface for forming the light-emitting element 313 over the transistor. Further, by providing the insulating layer 312, the parasitic capacitance which is generated by a conductive layer provided above the insulating layer 312 and a conductive layer provided below the insulating layer 312 can be reduced.

Further, in the case where the insulating layer 312 is formed using an organic resin such as acrylic, contaminant such as hydrogen and water may be included in the insulating layer 312. Thus, the insulating layer 312 is not necessarily used, and the insulating layer 312 may be formed as appropriate as needed, for example, an insulating layer 312 which is directly on the display element or the element for driving the display element is removed.

The light-emitting element 313 includes a pair of electrodes, a first electrode layer 314 and a second electrode layer 317, and an EL layer 316 containing a light-emitting substance. The light-emitting element 313 can be provided over an interlayer insulating layer provided over a transistor including a pixel circuit, a scan line driver circuit, and the like (see FIG. 12). Note that the structure, material, and the like of the light-emitting element 313 are described in detail later.

Further, a color filter 320 is provided to overlap with the light-emitting element 313. A light-blocking layer 321 is provided to overlap with the partition 315, and the end portions of the light-blocking layer 321 are covered with the color filter 320. Moreover, an overcoat layer 319 is provided to cover the light-blocking layer 321 and the color filter 320.

As conductive materials for the first electrode layer 314 and the second electrode layer 317, a material that transmits light emitted from the EL layer 316 is used for an electrode through which light is transmitted, and a material that reflects light emitted from the EL layer 316 is used for an electrode provided on the side opposite to the electrode through which light is transmitted.

In this structural example, a reflective material is used for the first electrode layer 314 and a light-transmitting material is used for the second electrode layer 317. Thus, light emission from the EL layer 316 is emitted from the flexible substrate 322.

If necessary, an optical film such as a polarizing plate, a circularly polarizing plate (including an elliptically polarizing plate), a retardation plate (a quarter-wave plate or a half-wave plate), or the like may be appropriately provided for the flexible substrate 322. Further, the polarizing plate or the circularly polarizing plate may be provided with an anti-reflection film. For example, anti-glare treatment by which reflected light can be diffused by projections and depressions on the surface so as to reduce the glare can be performed.

As the light-transmitting material that can be used for the electrode (the second electrode layer 317) through which light is transmitted, indium oxide, indium oxide-tin oxide, indium oxide-zinc oxide, zinc oxide, zinc oxide to which gallium is added, graphene, and the like can be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the conductive layer may be thinned so as to be able to transmit light. Alternatively, a stack of any of the above materials can be used as the conductive layer. For example, a stacked film of a silver-magnesium alloy and indium oxide-tin oxide is preferably used, in which case electrical conductivity can be increased.

Note that the conductive oxide used as the electrode through which light is emitted can be formed by a sputtering method. When an electrically conductive oxide film is formed under an atmosphere containing argon and oxygen, the light-transmitting property can be increased.

Further, in the case of a top-emission structure, it is preferable that the conductive oxide film formed over the EL layer 316 be a stacked layer film of a first conductive oxide film formed under an atmosphere containing argon with reduced oxygen concentration and a second conductive oxide film formed under an atmosphere containing argon and oxygen, in which case film formation damage to the EL layer 316 can be reduced. In this case, in the formation of the first conductive oxide film, it is preferable to use an argon gas with purity, for example, an argon gas whose dew point is lower than or equal to −70° C., more preferably lower than or equal to −100° C.

As a light-reflecting material that can be used for the electrode (the first electrode layer 314) provided on the side opposite to the electrode through which light is transmitted, the following can be used: a metal material such as aluminum, gold, platinum, silver, nickel, tungsten, chromium, molybdenum, iron, titanium, cobalt, copper, and palladium; or an alloy material containing any of these metal materials. Alternatively, lanthanum, neodymium, germanium, or the like may be added to a metal or an alloy containing the metal material. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on and in contact with an aluminum alloy film, whereby oxidation of the aluminum alloy film can be prevented. As examples of a material for the metal film or the metal oxide film, titanium, titanium oxide, and the like are given. Alternatively, a stack of a film containing any of the above light-transmitting materials and a film containing any of the above metal materials may be used. For example, a stacked film of silver and indium oxide-tin oxide, a stacked film of a silver-magnesium alloy and indium oxide-tin oxide, or the like can be used.

The partition 315 is provided to cover the end of the first electrode layer 314. Moreover, the upper end portion or the lower end portion of the partition 315 preferably has a curved surface with a radius of curvature of 0.2 µm to 3 µm in order to be adequately covered with the second electrode layer 317 which is formed over the partition 315. The side surface of the partition 315 is preferably an inclined curved surface. The partition 315 can be formed using an organic compound such as a negative photosensitive resin or a positive photosensitive resin, or an inorganic compound such as silicon oxide or silicon oxynitride.

A wiring formed using a conductive layer 310 supplies power or inputs of the external signal to the display region 300, the scan line driver circuit, or the like. The conductive layer 310 extends to the end portion of the flexible substrate 302 through a peripheral region 301. An opening is provided in the insulating layer 311 in the end portion (that is, the external input terminal) of the flexible substrate 302, and the conductive layer 310 exposed in the opening is electrically connected to an FPC 327 through a conductive material such as an anisotropic conductive film 326.

Here, the peripheral region 301 is surrounded by the sealant 323. In the example of the light-emitting device in FIG. 12, the sealant 323 is directly in contact with the insulating layer 311 and the flexible substrate 322; however, layers, substrates, and bases which are in contact with the sealant 323 is not limited thereto, and various structures can be employed to the structure of the light-emitting device. Further, in the example of the light-emitting device in FIG. 12, the insulating layer 312 provided in the display region 300 is removed in the peripheral region 301.

The sealant 323 can be formed using the material described in the above embodiment and can be formed in the forming method described in the above embodiment.

Further, a conductive layer 328 is provided between the sealant 323 and the flexible substrate 302. By providing the conductive layer 328, a structure similar to the structure below the sealant at the side including the external input terminal can be formed; thus, conditions for forming the sealant 323 can be uniform and variations in formation on the substrate can be reduced.

Note that a space 318 surrounded by the sealant 323 is preferably a vacuum or filled with an inert gas such as a nitrogen gas or an argon gas in order to secure the reliability of the light-emitting element 313 and the transistors 304 and 305.

Further, a sealant 329 is provided in a gap between the flexible substrates 302 and 322 and on side surfaces of the flexible substrates 302 and 322. However, at the side in which the offset region for connecting the FPC 327 is provided, the sealant 329 is provided in the gap between the flexible substrates 302 and 322, on the side surface of the flexible substrate 322, and on a top surface of the insulating layer 311.

The sealant 329 includes a member 324 which is provided in an inner side and a member 325 which is provided in an outer side than the member 324. Each of the members can be formed using the material and by the forming method which are described in the above embodiment.

By doubly sealing the display region 300 by using the sealant 323 and the sealant 329 in the light-emitting device in this manner, entry of moisture or the like from the outside, which causes degradation of characteristics of the light-emitting element 313 and the semiconductor layers of the transistors 304 and 305, can be prevented or suppressed.

Thus, a light-emitting device which is thin and lightweight and has high flexibility, impact resistance, and reliability can be manufactured. Further, a light-emitting device which is thin and lightweight and has high flexibility, impact resistance, and hermeticity can be manufactured.

The structures, methods, and the like described in this embodiment can be combined with any of the structures, methods, and the like described in the other embodiments as appropriate.

(Embodiment 6)

In this embodiment, according to one embodiment of the display device of the present invention, a light-emitting device having a structure which is different from that of the light-emitting device described in Embodiment 5 is described with reference to FIG. 13. A light-emitting device described in this embodiment is the flexible light-emitting device using the structure of the display device 200a described in Embodiment 3.

Figure 13:
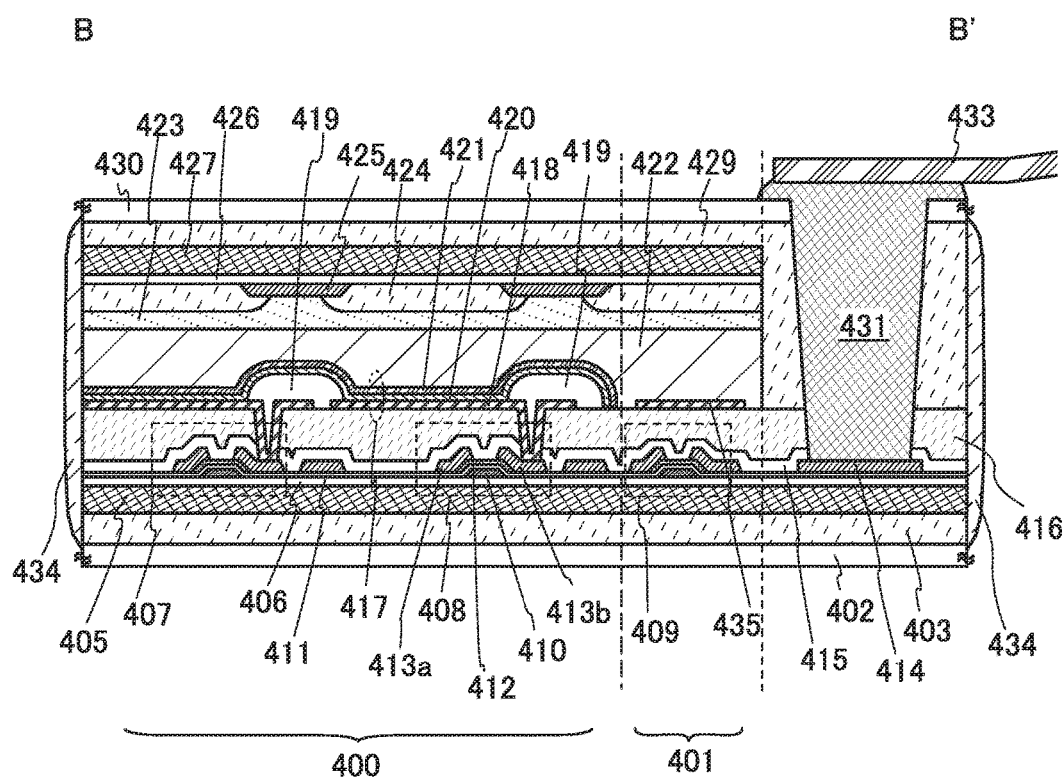
FIG. 13 is a cross-sectional view illustrating one embodiment of a display device.

FIG. 13 illustrates a part of a schematic cross-sectional view illustrating the cross-sectional view of the display device 200a in FIG. 7A in more detail in the case of applying the display device 200a to a light-emitting device. Note that FIG. 13 illustrates a part of the display region 400 provided in the sealed region of the light-emitting device.

Although not illustrated, the light-emitting device according to this embodiment may include a scan line driver circuit and a signal line driver circuit as in the light-emitting device described in Embodiment 5.

A light-emitting device according to this embodiment can be manufactured by a manufacturing method described in Embodiment 4. The light-emitting device is manufactured using a separation process and the like; thus, the light-emitting device includes a bonding layer 403, a layer 405, and a base layer 406 over a flexible substrate 402. Over (in the drawing, under) a flexible substrate 430 opposite to the flexible substrate 402, a bonding layer 429, a layer 427, and a base layer 426 are included. Further, an element layer and a color filter layer are bonded to each other with a bonding layer 422. The above layers can be formed using the material and by the forming method in Embodiment 4.

In the light-emitting device according to this embodiment, a protective circuit is provided in the peripheral region 401 as illustrated in FIG. 13. The protective circuit can be formed using a transistor 409 which is similar to a transistor used in the display region 400.

By providing the protective circuit between the external input terminal and the display region 400, transistors 407, 408, and the like in the display region 400 can be protected from an excessive voltage which is applied to the external input terminal or the like by mistake.

A conductive layer 435 formed in the same process as a first electrode layer included in the light-emitting element 417 may be formed over the transistor 409 included in the protective circuit. The conductive layer 435 functions as a back gate of the transistor by being provided to overlap with a semiconductor layer included in the transistor 409. For example, in the case of an n-channel transistor, a voltage between the back gate and a source may be negative. Thus, the threshold voltage of the transistor can be shifted to the positive direction. Further, the back gate can be set to a fixed potential such as 0 V, for example.

A conductive layer functioning as a back gate can be formed not only in the protective circuit, but also in the scan line driver circuit, the signal line driver circuit, and the pixel circuit.

FIG. 13 illustrates a cross-sectional structure of a part of a pixel as an example of the display region 400. The pixel includes a switching transistor or a current control transistor; however, here, the pixel includes current control transistors 407 and 408 that are electrically connected to a light-emitting element 417. A source electrode layer or a drain electrode layer 413*b* of the current control transistors 407 and 408 is electrically connected to a first electrode layer 418 included in the light-emitting element 417. In addition, a partition 419 covering the end portion of the first electrode layer 418 is provided.

Note that there is no particular limitation on the structures of the transistors included in the display region 400 and other circuits such as a scan line driver circuit and a signal line driver circuit which are not illustrated. For example, a forward staggered transistor or an inverted staggered transistor may be used. Furthermore, a top-gate transistor or a bottom-gate transistor may be used. As a semiconductor material used for the channel formation region in the transistors, for example, a semiconductor material such as silicon or germanium or an oxide semiconductor containing at least one of indium, gallium, and zinc may be used. In particular, it is preferable to use the oxide semiconductor in that the oxide semiconductor has many advantages such as high field-effect mobility and extremely low leakage current at the time of turning off the transistor. The oxide semiconductor is described in detail in another embodiment. Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used.

The transistors in FIG. 13 are bottom-gate transistors as examples. A gate insulating layer 411 is included over a gate electrode layer 410, and a semiconductor layer 412 including a channel formation region is included over the gate insulating layer 411. A source electrode layer and a drain electrode layer 413*a* and 413*b* are provided over the semiconductor layer 412 and an insulating layer 415 is provided to cover these electrode layers.

For the gate electrode layer 410 and the source electrode layer and the drain electrode layer 413*a* and 413*b*, for example, a layer containing a metal material such as molybdenum, titanium, chromium, tantalum, magnesium, silver, tungsten, aluminum, copper, neodymium, or scandium can be used. Further, the gate electrode layer 410 and the source electrode layer and the drain electrode layer 413*a* and 413*b* may each have a single layer or two or more layers.

Each of the gate insulating layer 411 and the insulating layer 415 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide. For example, the gate insulating layer 411 can be stacked layers of a silicon nitride layer and a silicon oxynitride layer. In this case, the silicon nitride layer may have stacked layers of a plurality of silicon nitride layers having different compositions.

Note that in the case where an oxide semiconductor is used for the semiconductor layer 412, in order to make an oxygen saturation state in the oxide semiconductor, it is preferable that insulating layers (the gate insulating layer 411 and the insulating layer 415) which are in contact with an oxide semiconductor layer contain excess oxygen.

As the insulating layer containing excess oxygen, a silicon oxide film or a silicon oxynitride film containing a large amount of oxygen by adjusting deposition conditions as appropriate in a plasma CVD method or a sputtering method is used. Further, oxygen may be added by an ion implantation method, an ion doping method, or plasma treatment.

In addition, a blocking layer (such as an $AlO_x$ layer) for suppressing release of oxygen from the oxide semiconductor layer is preferably provided as the gate insulating layer 411 or the insulating layer 415 so as to be positioned outside the insulating layer containing excess oxygen.

The insulating layer containing excess oxygen or the blocking layer is provided to cover the oxide semiconductor layer, whereby the oxide semiconductor layer can contain oxygen in a proportion which is substantially the same as that in the stoichiometric composition, or in a proportion higher than that in the stoichiometric composition i.e., the oxide semiconductor layer can be supersaturated.

An insulating layer 416 is provided over the insulating layer 415. The insulating layer 416 is formed using, for example, an organic resin such as acrylic and has a plane surface for forming the light-emitting element 417 over the transistor. Further, by providing the insulating layer 416, the parasitic capacitance which is generated by a conductive layer provided above the insulating layer 416 and a conductive layer provided below the insulating layer 416 can be reduced.

Further, in the case where the insulating layer 416 is formed using an organic resin such as acrylic, contaminant such as hydrogen and water may be included in the insulating layer 416. Thus, the insulating layer 416 is not necessarily used, and the insulating layer 416 may be formed as appropriate as needed, for example, an insulating layer 416 which is directly on the display element or the element for driving the display element is removed.

The light-emitting element 417 includes a pair of electrodes, a first electrode layer 418 and a second electrode layer 421, and an EL layer 420 containing a light-emitting substance. The light-emitting element 417 can be provided over an interlayer insulating layer provided over a transistor including a pixel circuit, a scan line driver circuit, and the like (see FIG. 13). Note that the structure, material, and the like of the light-emitting element 417 are described in detail later.

Further, a color filter 424 is provided to overlap with the light-emitting element 417. A light-blocking layer 425 is provided to overlap with the partition 419, and the end portions of the light-blocking layer 425 are covered with the color filter 424. Moreover, an overcoat layer 423 covers the light-blocking layer 425 and the color filter 424.

As conductive materials for the first electrode layer 418 and the second electrode layer 421, a material that transmits light emitted from the EL layer 420 is used for an electrode through which light is transmitted, and a material that reflects light emitted from the EL layer 420 is used for an electrode provided on the side opposite to the electrode through which light is transmitted.

In this structural example, a reflective material is used for the first electrode layer 418 and a light-transmitting material is used for the second electrode layer 421. Thus, light emission from the EL layer 420 is emitted from the flexible substrate 430.

As the light-transmitting material that can be used for the electrode (the second electrode layer 421) through which light is transmitted, indium oxide, indium oxide-tin oxide, indium oxide-zinc oxide, zinc oxide, zinc oxide to which gallium is added, graphene, and the like can be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the conductive layer may be thinned so as to be able to transmit light. Alternatively, a stack of any of the above materials can be used as the conductive layer. For example, a stacked film of a silver-magnesium alloy and indium oxide-tin oxide is preferably used, in which case electrical conductivity can be increased.

Note that the conductive oxide used as the electrode through which light is emitted can be formed by a sputtering method. When an electrically conductive oxide film is formed under an atmosphere containing argon and oxygen, the light-transmitting property can be increased.

Further, in the case of a top-emission structure, it is preferable that the conductive oxide film formed over the EL layer 420 be a stacked layer film of a first conductive oxide film formed under an atmosphere containing argon with reduced oxygen concentration and a second conductive oxide film formed under an atmosphere containing argon and oxygen, in which case film formation damage to the EL layer 420 can be reduced. In this case, in the formation of the first conductive oxide film, it is preferable to use an argon gas with purity, for example, an argon gas whose dew point is lower than or equal to −70° C., more preferably lower than or equal to −100° C.

As a light-reflecting material that can be used for the electrode (the first electrode layer 418) provided on the side opposite to the electrode through which light is transmitted, the following can be used: a metal material such as aluminum, gold, platinum, silver, nickel, tungsten, chromium, molybdenum, iron, titanium, cobalt, copper, and palladium; or an alloy material containing any of these metal materials. Alternatively, lanthanum, neodymium, germanium, or the like may be added to a metal or an alloy containing the metal material. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on and in contact with an aluminum alloy film, whereby oxidation of the aluminum alloy film can be prevented. As examples of a material for the metal film or the metal oxide film, titanium, titanium oxide, and the like are given. Alternatively, a stack of a film containing any of the above light-transmitting materials and a film containing any of the above metal materials may be used. For example, a stacked film of silver and indium oxide-tin oxide, a stacked film of a silver-magnesium alloy and indium oxide-tin oxide, or the like can be used.

The partition 419 is provided to cover the end of the first electrode layer 418. Moreover, the upper end portion or the lower end portion of the partition 419 preferably has a curved surface with a radius of curvature of 0.2 µm to 3 µM in order to be adequately covered with the second electrode layer 421 which is formed over the partition 419. The side surface of the partition 419 is preferably an inclined curved surface. The partition 419 can be formed using an organic compound such as a negative photosensitive resin or a positive photosensitive resin, or an inorganic compound such as silicon oxide or silicon oxynitride.

A wiring formed using a conductive layer 414 supplies power or inputs of the external signal to the display region 400, the scan line driver circuit, or the like. The conductive layer 414 extends to the end portion of the flexible substrate 402 through a peripheral region 401 (not illustrated). An opening is provided in the insulating layer 415 in the end portion (that is, the external input terminal) of the flexible substrate 402, and the conductive layer 414 exposed in the opening is electrically connected to an FPC 433 through a conductive material such as an anisotropic conductive film 431.

Here, a member 434 serving as a sealant is provided on side surfaces of the flexible substrates 402 and 430. The member 434 can be formed using the material and by the forming method which are described in the above embodiment.

By sealing the display region 400 by using the member 434 in the light-emitting device in this manner, entry of moisture or the like from the outside, which causes degradation of characteristics of the light-emitting element 417 and the semiconductor layers of the transistors 407, 408, and 409, can be prevented or suppressed.

Thus, a light-emitting device which is thin and lightweight and has high flexibility, impact resistance, and reliability can be manufactured. Further, a light-emitting device which is thin and lightweight and has high flexibility, impact resistance, and hermeticity can be manufactured.

The structures, methods, and the like described in this embodiment can be combined with any of the structures, methods, and the like described in the other embodiments as appropriate.

(Embodiment 7)

In this embodiment, in the case where a transistor is used as an element for driving a display element of a display device, an oxide semiconductor which can be used for a channel formation region in the transistor is described in detail.

At least indium (In) or zinc (Zn) is preferably contained as an oxide semiconductor used for a channel formation region in a transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, the following can be used, for example: a four-component metal oxide such as an In—Sn—Ga—Zn-based oxide; a three-component metal oxide such as an In—Ga—Zn-based oxide, an In—Sn—Zn-based oxide, an In—Zr—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide;

or a one-component metal oxide such as an In-based oxide, a Sn-based oxide, or a Zn-based oxide.

Note that here, for example, an In—Ga—Zn-based oxide refers to an oxide mainly containing In, Ga, and Zn, and there is no limitation on the ratio of In to Ga and Zn.

Alternatively, a material represented by $InMO_3(ZnO)_m$ (m>0) may be used as the oxide semiconductor. Note that M represents one or more metal elements selected from Ga, Fe, Mn, and Co. Still alternatively, a material represented by $In_2SnO_5(ZnO)_n$ (n>0) may be used as the oxide semiconductor.

For example, an In—Ga—Zn-based oxide with an atomic ratio of In:Ga:Zn=3:1:2, In:Ga:Zn=1:1:1, or In:Ga:Zn=2:2:1, or an oxide whose atomic ratio is in the neighborhood of the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide whose atomic ratio is in the neighborhood of the above atomic ratios may be used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy Formula (1).

$$(a-A)^2+(b-B)^2+(c-C)^2 \le r^2 \quad (1)$$

($r^2$ is greater than or equal to $(a-A)^2+(b-B)^2+(c-C)^2$.)

In the formula 1, r may be 0.05, for example. The same applies to other oxides.

However, the composition of the oxide semiconductor is not limited to those described above, and an oxide semiconductor having an appropriate composition may be used depending on necessary semiconductor characteristics (e.g., field-effect mobility or threshold voltage). In order to obtain the required semiconductor characteristics, it is preferable that the carrier concentration, the impurity concentration, the defect density, the atomic ratio between a metal element and oxygen, the interatomic distance, the density, and the like be set to appropriate values.

When an oxide semiconductor is highly purified, the off-state current of a transistor using such an oxide semiconductor in a channel formation region can be sufficiently reduced (here, the off-state current means a drain current when a potential difference between a source and a gate is equal to or lower than the threshold voltage in the off state, for example). A highly purified oxide semiconductor can be obtained, for example, in such a manner that a film is deposited while heating is performed so as to prevent hydrogen and a hydroxyl group from being contained in the oxide semiconductor, or heat treatment is performed after film deposition so as to remove hydrogen and a hydroxyl group from the film. When an In—Ga—Zn-based oxide which is used for a channel region of a transistor is highly purified, the off-state current per channel width can be approximately from $1 \times 10^{-24}$ A/μm (1 yA/μm) to $1 \times 10^{-22}$ A/μm (100 yA/μm).

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The structures, methods, and the like described in this embodiment can be combined with any of the structures, methods, and the like described in the other embodiments as appropriate.

(Embodiment 8)

In this embodiment, an example of a light-emitting element which can be used as the light-emitting elements 313 and 417 included in the display device described in the above embodiment is described with reference to FIGS. 14A and 14B.

Figure 14A:
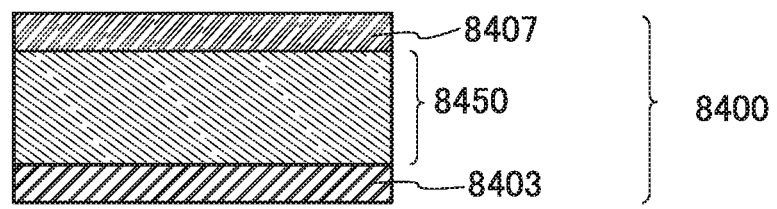
FIGS. 14A and 14B each illustrate a light-emitting element of a display device.

The light-emitting element shown in FIG. 14A has a structure in which the EL layer 8450 including a light-emitting region is interposed between a pair of electrodes (the first electrode layer 8403 and the second electrode layer 8407). The first electrode layer 8403 and the second electrode layer 8407 can be used as the first electrode layers 314 and 418 and the second electrode layers 317 and 421 of the light-emitting device which is described in the above embodiment.

The EL layer 8450 includes at least a light-emitting layer and may have a stacked structure including a functional layer in addition to the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

The light-emitting element 8400 illustrated in FIG. 14A emits light when current flows because of the potential difference generated between the first electrode layer 8403 and the second electrode layer 8407, and holes and electrons are recombined in the EL layer 8450. That is, the light-emitting region is formed in the EL layer 8450.

Figure 14B:
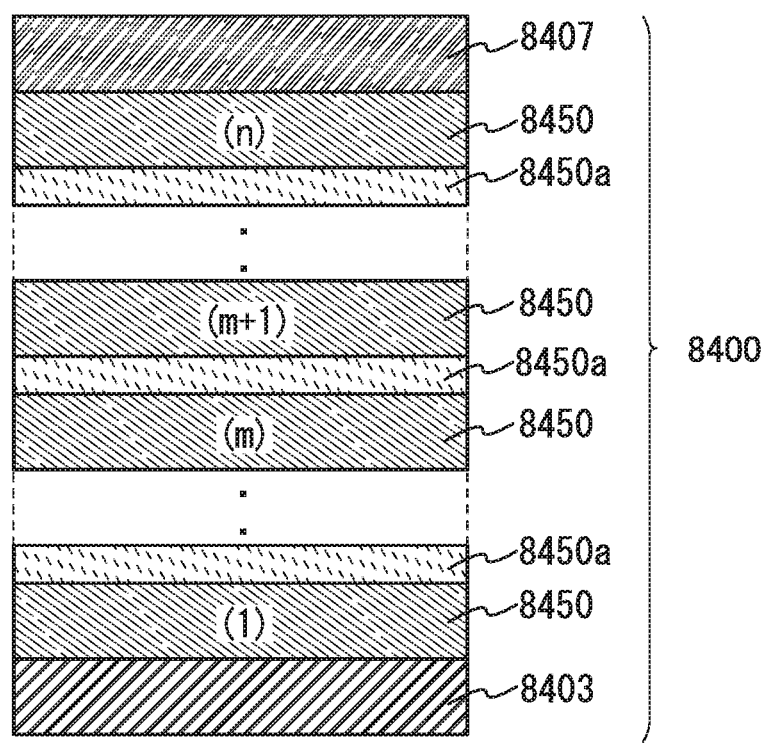

Note that a plurality of EL layers 8450 may be stacked between the first electrode layer 8403 and the second electrode layer 8407 as illustrated in FIG. 14B. In the case where n (n is a natural number of 2 or more) layers are stacked, a charge generation layer 8450a is preferably provided between each m-th (m is a natural number of from 1 to n−1) EL layer and each (m+1)-th EL layer.

The charge generation layer 8450a can be formed using a composite material of an organic compound and a metal oxide, a metal oxide, or a composite material of an organic compound and alkali metal, alkaline earth metal, or a compound thereof. Examples of the composite material of an organic compound and a metal oxide include composite materials of an organic compound and a metal oxide such as vanadium oxide, molybdenum oxide, and tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transport property and has a hole mobility of $10^{-6}$ $cm^2/Vs$ or higher. However, other substances than the above described materials may also be used as long as the substances have higher hole-transport properties than electron-transport properties. These materials used for the charge generation layer 8450a are excellent in carrier-injection properties and carrier-transport properties, so that the light-emitting element shown in FIGS. 14A and 14B can be driven at low current at low voltage.

It is to be noted that the charge generation layer 8450a may be formed with a combination of a composite material of an organic compound and metal oxide and another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

As for a light-emitting element having such a structure, problems such as energy transfer and quenching occur with difficulty, and a light-emitting element which has both high light emission efficiency and long lifetime can be easily obtained due to expansion in the choice of materials. Further, a light-emitting element which provides phosphorescence from one of light-emitting layers and fluorescence from the other of the light-emitting layers can be easily obtained.

The charge generation layer 8450a has a function of injecting holes to one of the EL layers 8450 which is formed in contact with the charge generation layer 8450a and a function of injecting electrons to the other of the EL layers 8450 which is formed in contact with the charge generation layer 8450a, when a voltage is applied to a first electrode 8403 and a second electrode 8407.

The light-emitting element 8400 shown in FIG. 14B can provide a variety of emission colors by changing the type of the light-emitting substance that is used for the EL layer 8450. In addition, a plurality of light-emitting substances of different colors is used as the light-emitting substance, whereby light emission having a broad spectrum or white light emission can also be obtained.

In the case of obtaining white color light using the light-emitting element shown in FIG. 14B, as for the combination of a plurality of EL layers, a structure for emitting white light including red light, green light, and blue light may be used, e.g., the structure may include a first light-emitting layer containing a blue fluorescent substance as a light-emitting substance and a second light-emitting layer containing red and green phosphorescent substances as light-emitting substances. Alternatively, a structure including a first light-emitting layer exhibiting red light, a second light-emitting layer exhibiting green light, and a third light-emitting layer exhibiting blue light may be employed. Also with a structure including light-emitting layers emitting light of complementary colors, white light emission can be obtained. When light emitted from the first light-emitting layer and light emitted from the second light-emitting layer have complementary colors to each other in a stacked-layer element including two light-emitting layers, the combination of colors are as follows: blue and yellow, blue-green and red, and the like.

Note that in the structure of the above-described stacked-layer element, by providing the charge generation layer between the stacked light-emitting layers, the element can have long lifetime in a high-luminance region while keeping the current density low. In addition, the voltage drop due to resistance of the electrode material can be reduced, whereby uniform light emission in a large area is possible.

The structures, methods, and the like described in this embodiment can be combined with any of the structures, methods, and the like described in the other embodiments as appropriate.

(Embodiment 9)

As examples of electronic appliances including a display device with flexibility, the following can be given: television devices (also referred to as televisions or television receivers), monitors of computers or the like, cameras such as digital cameras or digital video cameras, digital photo frames, mobile phones (also referred to as mobile phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

In this embodiment, examples of an electronic device or a lighting device using the display device of one embodiment of the present invention are described with reference to FIGS. 15A to 15C and FIGS. 16A to 16C.

Figure 15A:
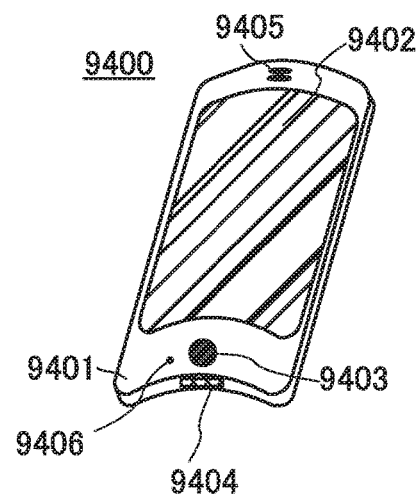
FIGS. 15A to 15C each illustrate an electronic appliance.

FIG. 15A illustrates an example of a mobile phone. A mobile phone 9400 includes a display portion 9402 incorporated in a housing 9401, operation buttons 9403, an external connection port 9404, a speaker 9405, a microphone 9406, and the like. Note that the mobile phone 9400 is manufactured using a display device according to one embodiment of the present invention for the display portion 9402.

In the mobile phone 9400 in FIG. 15A, a touch screen of a resistive type, a capacitive type, a surface acoustic wave type, an infrared type, or the like is provided in order to input formation by touching the display portion 9402 with a finger, a pen, or the like. Further, operations such as making a call and inputting text can be performed by touching the display portion 9402 with a finger or the like.

The power can be turned on or off by pressing the operation button 9403. In addition, types of images displayed on the display portion 9402 can be switched; for example, switching images from a mail creation screen to a main menu screen.

The display portion 9402 includes a display device according to one embodiment of the present invention; thus, a reliable mobile phone having a curved display portion can be provided.

Figure 15B:
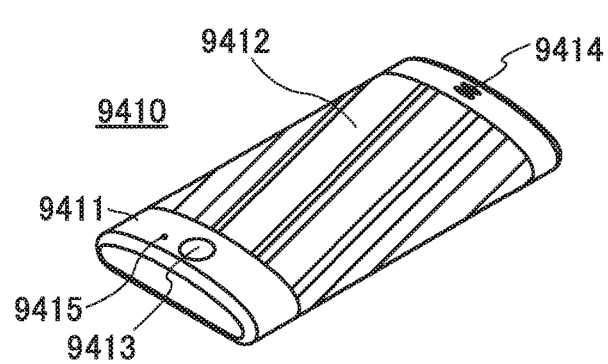

FIG. 15B illustrates an example of a multi-function portable information terminal which can be used for various applications such as a smartphone. A portable information terminal 9410 is provided with, in addition to a display portion 9412 incorporated in a housing 9411, operation buttons 9413, a speaker 9414, a microphone 9415, an external connection port such as a stereo headphone jack, an insertion port for a memory card, a camera, and a USB connector. Note that the portable information terminal 9410 is manufactured using a light-emitting device formed according to one embodiment of the present invention for the display portion 9412.

In the portable information terminal 9410 in FIG. 15B, a touch screen of a resistive type, a capacitive type, or the like is provided in order to input formation by touching the display portion 9412 with a finger, a pen, or the like. Further, operations such as making a call and inputting text can be performed by touching the display portion 9412 with a finger or the like.

The power can be turned on or off by pressing the operation button 9413. In addition, types of images displayed on the display portion 9412 can be switched; for example, switching images from a mail creation screen to a main menu screen.

The display portion 9412 includes a display device according to one embodiment of the present invention; thus, a reliable portable information terminal having a curved display portion can be provided.

Figure 15C:
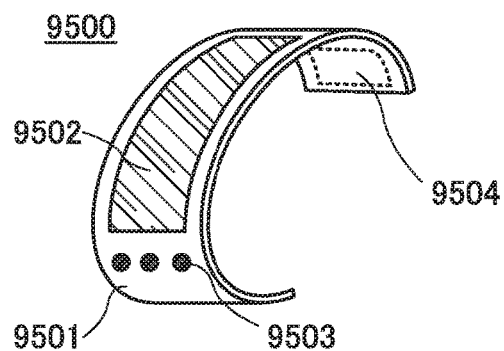

FIG. 15C is an example of a wristband-type display device. A portable display device 9500 includes a housing 9501, a display portion 9502, an operation button 9503, and a sending and receiving device 9504.

The portable display device 9500 can receive a video signal with the sending and receiving device 9504 and can display the received video on the display portion 9502. In addition, with the sending and receiving device 9504, the portable display device 9500 can send an audio signal to another receiving device.

Power ON/OFF, switching of displayed videos, adjusting volume, and the like can be performed by pressing the operation button 9503.

Here, the display portion 9502 includes the display device of one embodiment of the present invention. Thus, the mobile display device can have a curved display portion and high reliability.

Figure 16A:
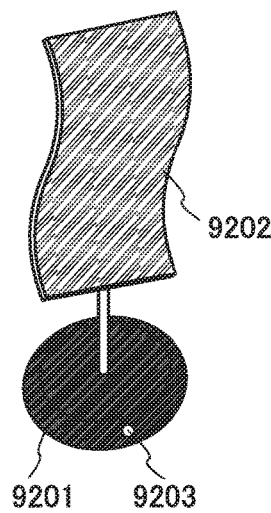
FIGS. 16A to 16C each illustrate an electronic appliance.
Figure 16B:
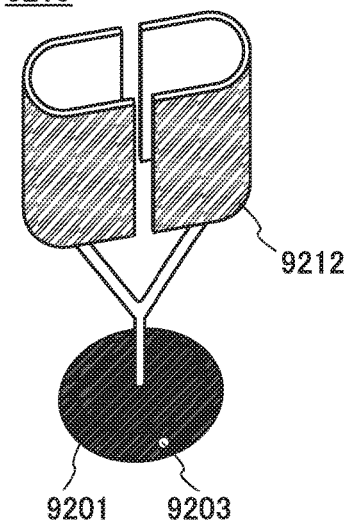
Figure 16C:
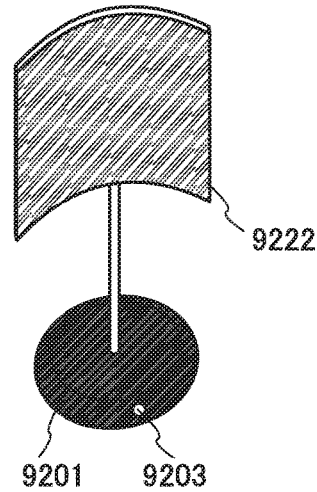

FIGS. 16A to 16C illustrate examples of lighting devices. Lighting devices 9200, 9210, and 9220 each include a stage 9201 provided with an operation switch 9203 and a light-emitting portion supported by the stage 9201.

The lighting device 9200 illustrated in FIG. 16A includes a light-emitting portion 9202 with a wave-shaped light-emitting surface, and thus has an elaborate design.

A light-emitting portion 9212 included in the lighting device 9210 illustrated in FIG. 16B has two convex-curved light-emitting portions symmetrically placed. Thus, light radiates from the lighting device 9210.

The lighting device 9220 illustrated in FIG. 16C includes a concave-curved light-emitting portion 9222. This is suitable for illuminating a specific range because light emitted from the light-emitting portion 9222 is collected to the front of the lighting device 9220.

The light-emitting portion included in each of the lighting devices 9200, 9210, and 9220 are flexible; thus, the light-emitting portion may be fixed on a plastic member, a movable frame, or the like so that an emission surface of the light-emitting portion can be bent freely depending on the intended use.

Here, the light-emitting portions 9202, 9212, and 9222 each include the light-emitting device of one embodiment of the present invention using the light-emitting element as the display element. Thus, the lighting devices can have curved light-emitting portions and high reliability.

As described above, when the display device which is one embodiment of the present invention is used, an electronic device and a lighting device which are thin and lightweight and has high flexibility, impact resistance, and reliability can be provided.

The structures, methods, and the like described in this embodiment can be combined with any of the structures, methods, and the like described in the other embodiments as appropriate.

This application is based on Japanese Patent Application serial no. 2012-188057 filed with Japan Patent Office on Aug. 28, 2012, the entire contents of which are hereby incorporated by reference.

What is claimed is:

1. A method for manufacturing a display device, comprising:
    forming an insulating film over and in contact with a first substrate with flexibility;
    forming a first sealant continuously surrounding a display region over the insulating film;
    irradiating the first sealant with a first laser beam;
    bonding a second substrate with flexibility to the first substrate with the first sealant;
    irradiating the first sealant with a second laser beam;
    forming a second sealant continuously surrounding the first sealant in a gap between the first substrate and the second substrate and on a side surface of the first substrate and a side surface of the second substrate; and
    forming a member in contact with a side surface of the second sealant,
    wherein the member comprises a bottom surface portion in contact with a top surface of the insulating film.

2. The method according to claim 1, wherein the first sealant comprises glass.

3. The method according to claim 1, wherein the second sealant comprises a resin material or glass.

4. The method according to claim 1, wherein the member comprises a metal material.

5. The method according to claim 1, wherein the member surrounds the second sealant.

6. The method according to claim 1, wherein a wavelength of the first laser beam is 810 nm or 940 nm.

7. The method according to claim 1, wherein the second laser beam is irradiated from a side surface direction of the first substrate.

8. A method for manufacturing a display device, comprising:
    forming an insulating film over and in contact with a first substrate with flexibility;
    forming a first sealant continuously surrounding a display region over the insulating film;
    irradiating the first sealant with a first laser beam;
    bonding a second substrate with flexibility to the first substrate with the first sealant;
    irradiating the first sealant with a second laser beam;
    forming a second sealant continuously surrounding the first sealant in a gap between the first substrate and the second substrate and on a side surface of the first substrate and a side surface of the second substrate;
    forming a member in contact with a side surface of the second sealant; and
    forming an FPC over the first substrate,
    wherein the member comprises a bottom surface portion in contact with a top surface of the insulating film.

9. The method according to claim 8, wherein the first sealant comprises glass.

10. The method according to claim 8, wherein the second sealant comprises a resin material or glass.

11. The method according to claim 8, wherein the member comprises a metal material.

12. The method according to claim 8, wherein the member surrounds the second sealant.

13. The method according to claim 8, wherein a wavelength of the first laser beam is 810 nm or 940 nm.

14. The method according to claim 8, wherein the second laser beam is irradiated from a side surface direction of the first substrate.

* * * * *